United States Patent
Devilliers et al.

(10) Patent No.: US 11,393,694 B2
(45) Date of Patent: Jul. 19, 2022

(54) METHOD FOR PLANARIZATION OF ORGANIC FILMS

(71) Applicant: Tokyo Electron Limited, Tokyo (JP)

(72) Inventors: Anton Devilliers, Clifton Park, NY (US); Robert Brandt, Ballston Lake, NY (US); Jeffrey Smith, Clifton Park, NY (US); Jodi Grzeskowiak, Cuddebackville, NY (US); Daniel Fulford, Cohoes, NY (US)

(73) Assignee: Tokyo Electron Limited, Tokyo (JP)

( * ) Notice: Subject to any disclaimer, the term of this patent is extended or adjusted under 35 U.S.C. 154(b) by 226 days.

(21) Appl. No.: 16/674,790

(22) Filed: Nov. 5, 2019

(65) Prior Publication Data
US 2020/0152472 A1 May 14, 2020

Related U.S. Application Data

(60) Provisional application No. 62/760,622, filed on Nov. 13, 2018.

(51) Int. Cl.
*H01L 21/3105* (2006.01)
*H01L 21/027* (2006.01)
(Continued)

(52) U.S. Cl.
CPC ...... *H01L 21/31058* (2013.01); *G03F 7/0045* (2013.01); *G03F 7/091* (2013.01);
(Continued)

(58) Field of Classification Search
CPC ........... H01L 21/31058; H01L 21/0276; H01L 21/0332; H01L 21/31144; H01L 21/76816;
(Continued)

(56) References Cited

U.S. PATENT DOCUMENTS

| 6,905,621 B2 | 6/2005 | Ho et al. |
| 8,431,331 B2 | 4/2013 | Kang et al. |

(Continued)

FOREIGN PATENT DOCUMENTS

| KR | 10-2009-0115564 A | 11/2009 |
| KR | 10-2016-0121059 A | 10/2016 |

OTHER PUBLICATIONS

International Search Report and Written Opinion dated Apr. 10, 2020 in PCT/US2019/060872, 9 pages

*Primary Examiner* — Caleen O Sullivan
(74) *Attorney, Agent, or Firm* — Oblon, McClelland, Maier & Neustadt, L.L.P.

(57) ABSTRACT

Techniques herein include methods for planarizing films including films used in the fabrication of semiconductor devices. Such fabrication can generate structures on a surface of a substrate, and these structures can have a spatially variable density across the surface. Planarization methods herein include depositing a first acid-labile film overtop the structures and the substrate, the first acid-labile film filling between the structures. A second acid-labile film is deposited overtop the first acid-labile film. An acid source film is deposited overtop the second acid-labile film, the acid source film including an acid generator configured to generate an acid in response to receiving radiation having a predetermined wavelength of light. A pattern of radiation is projected over the acid source film, the pattern of radiation having a spatially variable intensity at predetermined areas of the pattern of radiation.

20 Claims, 16 Drawing Sheets

(51) Int. Cl.
  *G03F 7/004* (2006.01)
  *G03F 7/09* (2006.01)
  *G03F 7/38* (2006.01)
  *G03F 7/16* (2006.01)
  *G03F 7/32* (2006.01)
  *G03F 7/20* (2006.01)
(52) U.S. Cl.
  CPC .............. *G03F 7/094* (2013.01); *G03F 7/162* (2013.01); *G03F 7/168* (2013.01); *G03F 7/20* (2013.01); *G03F 7/322* (2013.01); *G03F 7/38* (2013.01); *H01L 21/0276* (2013.01)
(58) Field of Classification Search
  CPC ........... H01L 21/0337; H01L 21/31051; H01L 21/31055; H01L 21/31056; G03F 7/0045; G03F 7/091; G03F 7/094; G03F 7/162; G03F 7/168; G03F 7/20; G03F 7/322; G03F 7/38; G03F 7/2051; G03F 7/0035
  USPC .......................................... 430/311, 313, 314
  See application file for complete search history.

(56) References Cited

U.S. PATENT DOCUMENTS

| | | |
|---|---|---|
| 8,778,598 B2 | 7/2014 | Kang et al. |
| 10,134,606 B2 | 11/2018 | Woo et al. |
| 2004/0069745 A1 | 4/2004 | Ho et al. |
| 2009/0274980 A1 | 11/2009 | Kang et al. |
| 2014/0004705 A1 | 1/2014 | Kang et al. |
| 2015/0340246 A1 | 11/2015 | Woo et al. |
| 2016/0299427 A1 | 10/2016 | Kim et al. |
| 2018/0314155 A1 | 11/2018 | Hou et al. |

Background

METHOD FOR PLANARIZATION OF ORGANIC FILMS

INCORPORATION BY REFERENCE

This present disclosure claims the benefit of U.S. Provisional Application No. 62/760,622, filed on Nov. 13, 2018, which is incorporated herein by reference in its entirety.

FIELD OF THE INVENTION

The present disclosure relates to a method of fabrication of semiconductor devices and particularly to planarization techniques for topology correction.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor manufacturing includes photolithographic and patterning processes. Some photolithographic processes include coating a wafer with a thin film of bottom anti-reflective coating (BARC) material, followed by coating with a resist, and then exposing the wafer to a pattern of light as one of many process steps for creating microchips. A latent pattern within the resist can then be developed to result in a relief pattern (topographic pattern) used for subsequent processing, such as pattern transfer by etching into underlying layers.

In a lithographic process, it is desirable from a depth-of-focus (DOF) perspective that a layer on which a photoresist system (including any anti-reflective, under-layer, and spin-on carbon film) is to be imaged is as planar or flat as possible. Any variability in the planarity of the layer, either from film non-uniformity caused by the deposition or coating process, or from any topography variance in the underlying substrate, will offset the optimal focus and will degrade image quality, leading to poor localized critical dimension (CD) uniformity, line edge roughness, image blur or tapering, and in some cases, merging of two structures resulting in localized bridging defects, or closing of intended contact holes, which can result in yield defects in downstream integration. Thus, a solution to improve film planarity during processing is desired.

SUMMARY

The present disclosure relates to a method of planarizing a film, including providing structures on a surface of a substrate, the structures having a spatially variable density across the surface; depositing a first acid-labile film overtop the structures and the substrate, the first acid-labile film filling between the structures; depositing a second acid-labile film overtop the first acid-labile film; depositing an acid source film overtop the second acid-labile film, the acid source film including an acid generator configured to generate an acid in response to receiving radiation having a predetermined wavelength of light; and projecting a pattern of radiation over the acid source film, the radiation having a spatially variable intensity at predetermined areas of the pattern of radiation.

The disclosure additionally relates to a method of planarizing a film, including: providing structures on a surface of a substrate, the structures having a spatially variable density across the surface; depositing a first acid-labile film overtop the structures and the substrate, the first acid-labile film filling between the structures; depositing an acid source film overtop the first acid-labile film, the acid source film including an acid generator configured to generate an acid in response to receiving radiation having a predetermined wavelength of light; generating a correction pattern of radiation to project on the acid source film by emulating a fabrication process of the structures and the deposition of the first acid-labile film overtop the structures and the substrate; and projecting the correction pattern of radiation over the acid source film, the radiation having a spatially variable intensity at predetermined areas of the pattern of radiation.

The disclosure additionally relates to a method of planarizing a film, including: providing structures on a surface of a substrate, the structures having a spatially variable density across the surface; depositing a first acid-labile film overtop the structures and the substrate, the first acid-labile film filling between the structures, the first acid-labile film including an embedded acid generator configured to generate an acid in response to receiving radiation having a predetermined wavelength of light, the first acid-labile film being soluble to the acid; and projecting a pattern of radiation over the first acid-labile film, the radiation having a spatially variable intensity at predetermined areas of the pattern of radiation.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
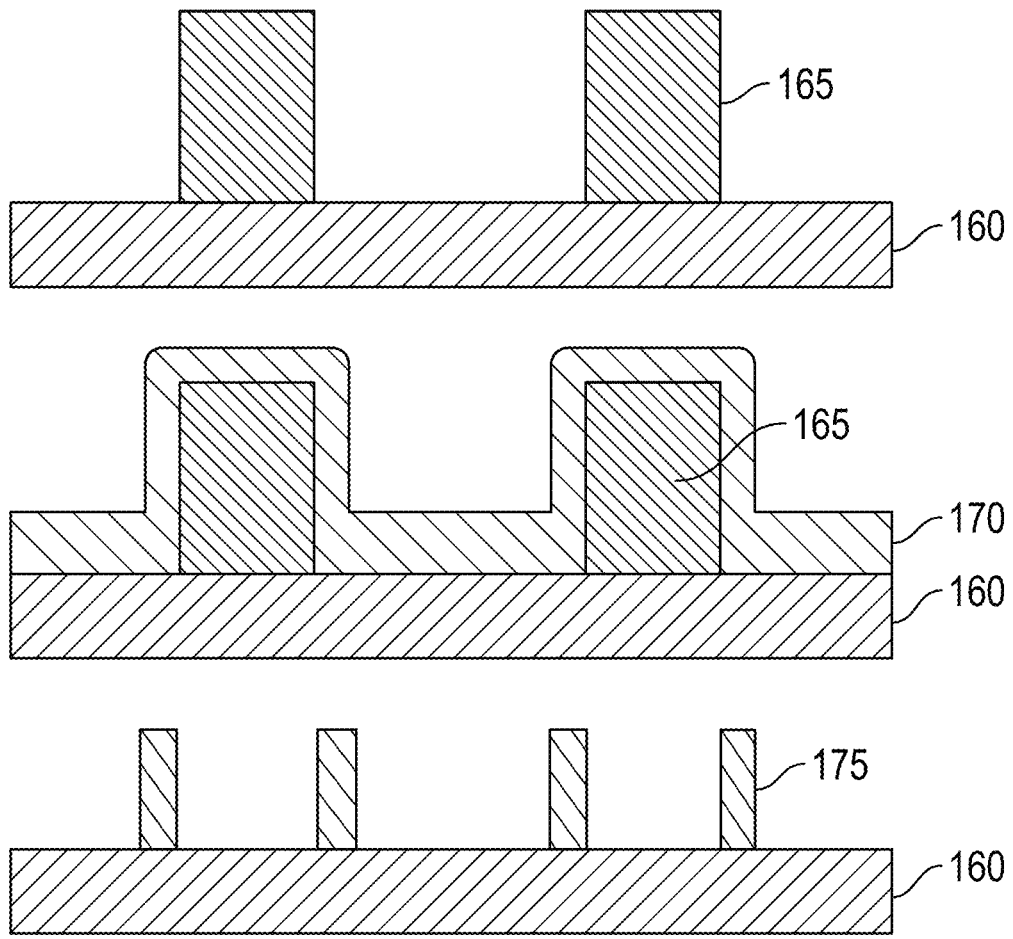
FIG. 1 is a side view of a simplified cross-sectional schematic of a substrate segment showing self-aligned double patterning (SADP) process, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Planarization for lithography can be executed using various methods. For example, a film, such as silicon oxide, can be deposited on a substrate over existing topography, and then the film can be polished to produce a planar or flat film. In another example, an organic film (such as spin-on carbon) can be spin-coated to produce a surface that is more planar than an underlying topography. Also, combinations of sequential film deposition, chemical-mechanical polishing (CMP), deposition or spin-coating of multiple films can be used to produce a final planar surface.

Such techniques, however, can have limitations. For example, while spin-on coatings provide improved planarity as compared to underlying topography, such coatings can have significant height variation on a nanometer scale. The planarity can be insufficient in preventing errors (in metrology, subsequent processing, etc.), especially when printing features with pitches below, for example, 80 nanometers. CMP also can have limitations. CMP can use corrosive chemicals and physical abrasion which can be incompatible with many microfabrication processes. For example, CMP cannot be used on many front-end-of line structures—especially when a gate oxide is exposed. Moreover, CMP processes can be very expensive to run, challenging to perform, and typically reduce yield of functional integrated circuits.

Techniques herein provide planarization methods that are effective, economical, and compatible with the various semiconductor device fabrication steps. Techniques include depth-limited solubility changing (top-down) of selected areas of a spin-coated or vapor deposited film so that, after development, a resulting film is planar. An acid-containing film can be deposited on the spin-coated or vapor-deposited film to provide an agent to change solubility that can be spatially activated. Techniques include emulating multiple microfabrication processing steps to generate a predicted z-height map which can then be used to generate exposure correction patterns without measuring underlying topography prior to depositing planarizing films. Accordingly, films can be quickly and accurately planarized using coater-develop (track) tools without incorporating specialized measurement tools and polishing tools.

With the onset of multiple patterning approaches, there has been an increase in the number of layers or process modules in which there exists underlying topography that affects subsequent lithographic layers. In one example, for metal definition, a method includes forming a line and space grid pattern through self-aligned double patterning (SADP) and/or self-aligned quadruple patterning (SAQP), and utilizing lithographic processes to define and memorize cuts or blocks into the metal pattern memorized into a hard-mask film. With dual damascene processing, once the metal pattern is memorized into a single or multiple hard-mask film, corresponding via patterning can be executed directly overtop this patterned, memorization film containing significant topography.

FIG. 1 shows a simplified cross-sectional schematic of a self-aligned double patterning (SADP) process, according to an embodiment of the present disclosure. A brief process flow is described as follows. First, mandrels 165 can be formed on a surface of a substrate 160. For example, the mandrel 165 pattern can be defined with a mask and formed via etching. Subsequently, a spacer layer 170 can be deposited over the substrate 160 and mandrels 165. The spacer layer 170 can be etched to recess the spacer layer 170 below a height of the mandrels 165 and wherein the spacer layer 170 material adjacent to the mandrels 165 and on the surface of the substrate 160 is removed entirely. The mandrels 165 can then be removed to leave spacers 175 (resembling posts as shown) remaining on the surface. The spacer layer 170 deposition over the spacers 175 and spacer layer 170 etching can be repeated again if desired to yield the SAQP process, wherein the spacer layer 170 material may be a different material for the repeated step.

In some cases, planarization control can be performed through incorporation of a predetermined type of spin-on film, which can have some marginal self-planarizing capability compared to more conformal-like depositions that would be seen through non-spin coating deposition methods. These planar films can reduce the total variance of the film thickness over given topographies seen in these process modules. Nevertheless, the variance reduction can be insufficient for subsequent processing. Specifically, the reduction seen can be generally insufficient to maintain a flat enough surface to support advanced lithography in terms of process latitude control, specifically depth-of-field (DOF). The planarity can also be insufficient to maintain other types of non-lithography patterning processes such as etch-recessing films down to reveal (uncover) underlying patterns.

A film which can be used for this application is, for example, spin-on carbon containing films. These films can provide myriad benefits. For example, the film can serve as an initial planarization film for the subsequent lithography process. For example, a material of the film can have tuned n & k optical parameters that will entail absorption of light from the exposure process in a manner that can reduce unwanted reflectivity. For example, the film can be a transfer layer in which higher aspect ratios can be attained over conventional photoresists in which the photoresist pattern is transferred through a silicon-containing film and into the spin-on carbon film, during which the resist pattern can be consumed in the etch transfer process to the spin-on carbon film. For typical ArF exposures, a thickness of such commercially available spin-on carbon films can vary within a wide range, but from a reflective perspective can usually be a minimum thickness of 700 A in order to suppress any unwanted reflection.

As lithographic patterning resolution is reduced through the incorporation of immersion lithography and extreme ultraviolet (EUV) lithography, there is a greater drive to control any factors driving de-focus as much as possible. Thus, there is an increasing demand for tighter planarization control of the spin-on carbon film Additionally, with the onset of multiple patterning processes such as anti-spacer patterning definition, tone reversal processes, self-aligned block generation for metal layers, and self-aligned vias and contacts, there are applications in which films such as spin-on carbon can be used outside of the intended purposes discussed above as a planar light-absorbing film used as part of the lithographic process. In these patterning applications, the spin-on carbon is incorporated as a gap-filling film which is desired to equally fill a given area of pattern density equal to an area with no or little pattern density.

An example will be described for the case of anti-spacer patterning, or a tone-inversion method to pattern a series of very small trenches, in which narrow trenches with atomic-level critical dimension precision are patterned through a spacer process in which a material is gap-filled into the spacer pattern, recessed down to uncover the spacers, and then the spacers exhumed, thus producing a narrow trench pattern that can then be transferred to an underlying hard-mask or memorization film. Good planarization control is desired in these cases because the primary recess etches are done essentially blind—without any etch stop material to control the etch process.

Figure 2A:
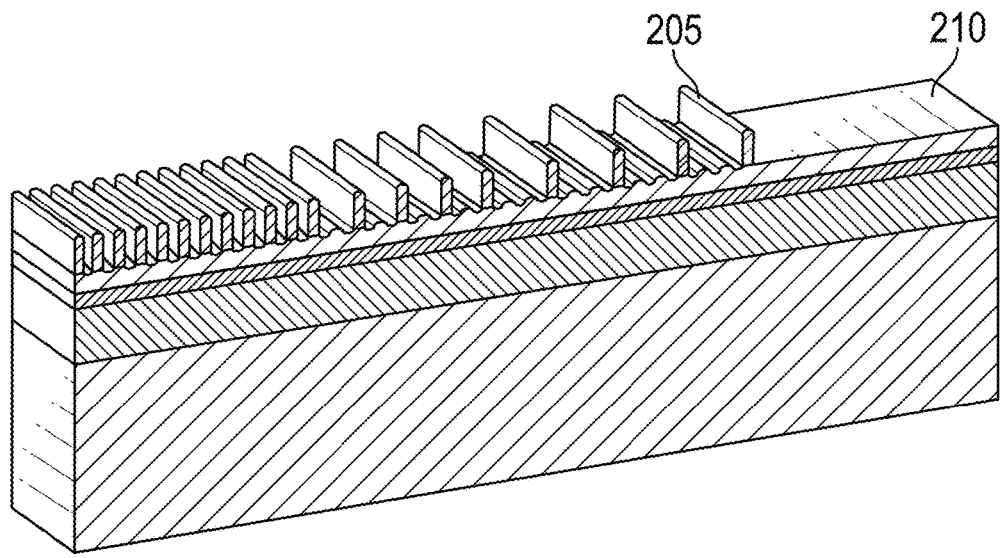
FIG. 2A is a cross-sectional perspective view of a substrate segment showing an example result of an anti-spacer process, according to an embodiment of the processing disclosure.

FIG. 2A shows an example result of an anti-spacer process, according to an embodiment of the processing disclosure. In an embodiment, the anti-spacer process yields spacers that are patterned and then subsequently exhumed in order to produce a series of narrow trenches which would otherwise be difficult to produce by a single exposure lithography process, according to an embodiment of the present disclosure. As previously described, the "anti-spacer" or "negative-tone spacer" process includes patterning a mandrel pattern and then subsequently depositing a conformal film over the mandrel pattern, and subsequently performing a spacer-open etch of the conformal film to open the top of the mandrel and then removing the mandrel through an etch process. The remaining pattern (FIG. 2A) includes a plurality of line spacers 205 (herein referred to as "line spacers 205") that can have etch-contrast to a hard mask 210 positioned below.

Figure 2B:
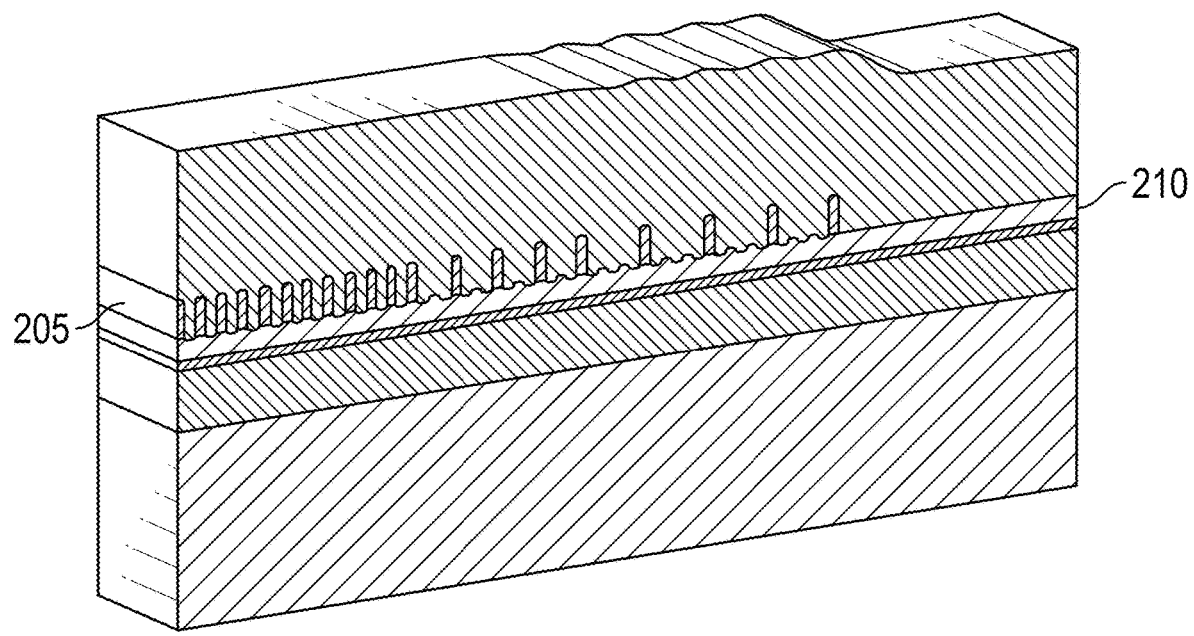
FIG. 2B is a cross-sectional perspective view of a substrate segment showing a plurality of line spacers coated with a planarizing film, according to an embodiment of the present disclosure.

FIG. 2B shows the line spacers 205 coated with a planarizing film 215, according to an embodiment of the present disclosure. In an embodiment, a spacer pattern can be subsequently spin-coated or chemical vapor deposition (CVD) deposited with the planarizing film 215, which covers all of the line spacers 205. Spin-on and CVD-deposited planarizing films 215 can have a significant height variance that can be determined by the pattern density of the underlying topography, for example a density of the line spacers 205 can determine the planarizing film's 215 height variance. As can be seen in the planarizing film 215 in FIG. 2B, a higher density of the line spacers 205 below can produce a more consistent height variance in the planarizing film 215 (i.e. it's flatter), but as the line spacers 205 density decreases (towards the right), the height variance can be seen as "ripples" on a surface of the planarizing film 215. When the density of the line spacers 205 approaches zero, meaning that there are no longer any of the line spacers 205 in an area, a height of the planarizing film 215 will show a step-like decrease as compared to the height of the planarizing film 215 over the higher density line spacers 205 area.

Figure 2C:
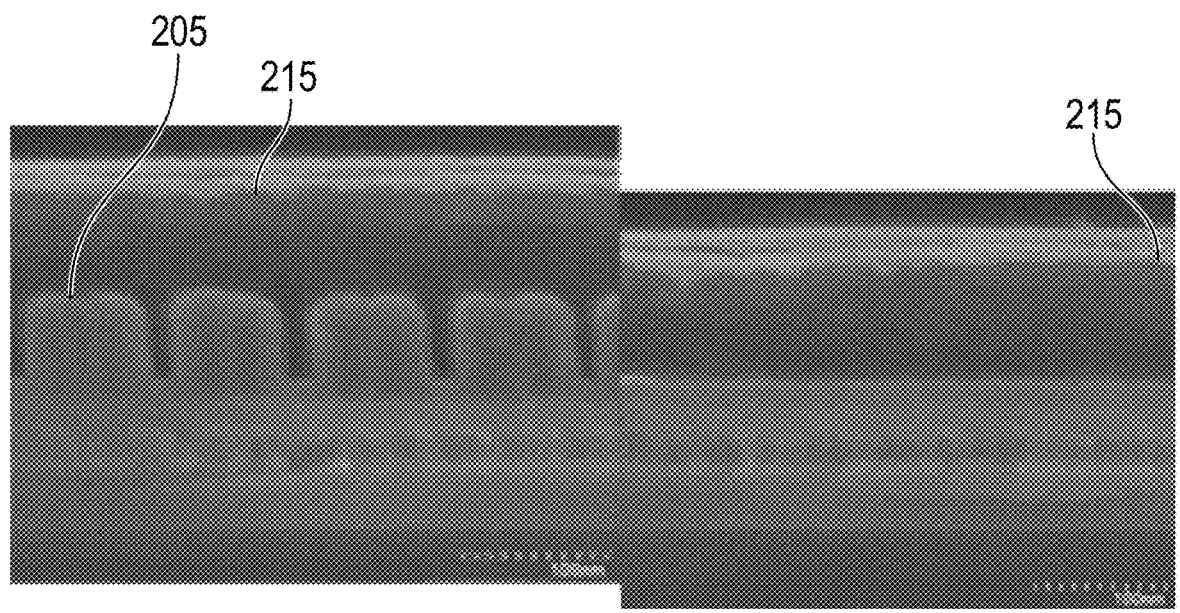
FIG. 2C is a scanning transmission electron microscopy (STEM) image with cross-section data, according to an embodiment of the present disclosure.

FIG. 2C shows scanning transmission electron microscopy (STEM) with cross-section data, according to an embodiment of the present disclosure. From said data, more complex wafer maps can be generated based on expected pattern topography. FIG. 2C shows two separate, magnified cross-section images placed side-by-side showing coating of a spin-on organic film over areas of dense topography (left image) and no topography (right image). In the left image, the topography includes 65-70 nm tall SiN line spacers 205 with the planarizing film 215 covering the dense line spacers 205 being 130 nm thick and applied through a conventional spin-on process. In this case, the height difference of the planarizing film 215 between the dense (left) and no pattern (right) areas is approximately 50 nm.

This height variation between areas having structures that are densely populated and areas that are not patterned (no structures) is significant from a lithographic process window perspective, because most critical layer exposures typically have under, for example, 100 nm total DOF and the film height variance of 50 nm (for the case of FIG. 2C) consumes automatically half of this DOF budget, which is also defined through multiple other parameters.

Figure 2D:
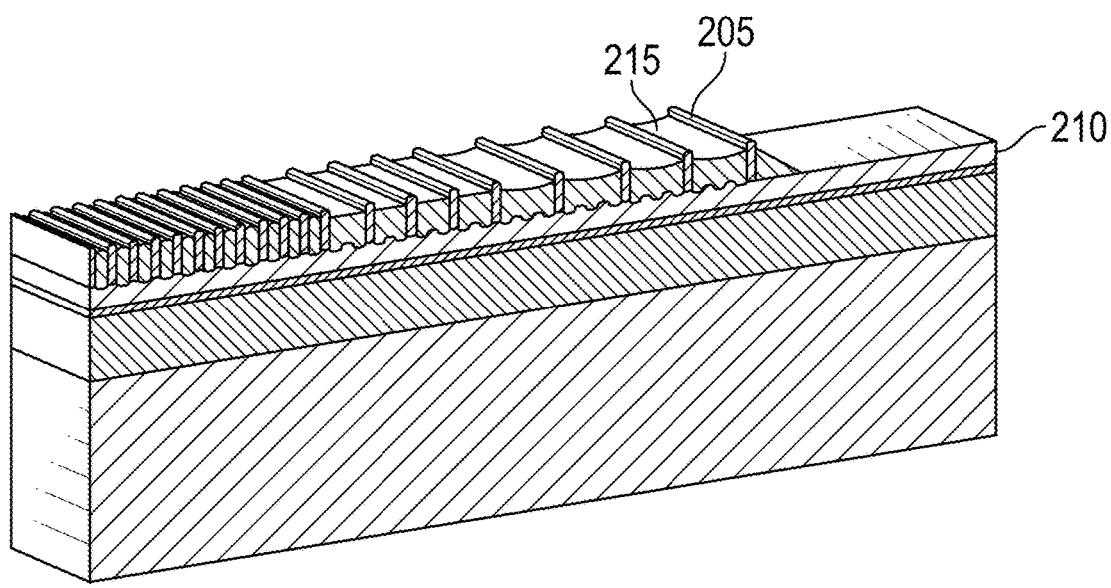
FIG. 2D is a cross-sectional perspective view of a substrate segment showing a planarizing film after an etch-recess, according to an embodiment of the present disclosure.

FIG. 2D shows the planarizing film 215 after an etch-recess, according to an embodiment of the present disclosure. In an embodiment, the planarizing film 215 is etch-recessed down to below a top of the line spacers 205. Some margin of over-etch ensures that all of the line spacers 205 have been "opened" as illustrated in FIG. 2D. After the line spacers 205 are all opened, they are selectively removed from the substrate through a line spacers 205 etch process to transform the line patterns of the line spacers 205 into a plurality of trench patterns 205a (herein referred to as "trench patterns 205a") now within the remaining planarizing film 215. The step height in the planarizing film 215 shown in FIGS. 2B and 2C produces an area where there is no remaining planarizing film 215 (towards the right) after the etch-recess.

Figure 2E:
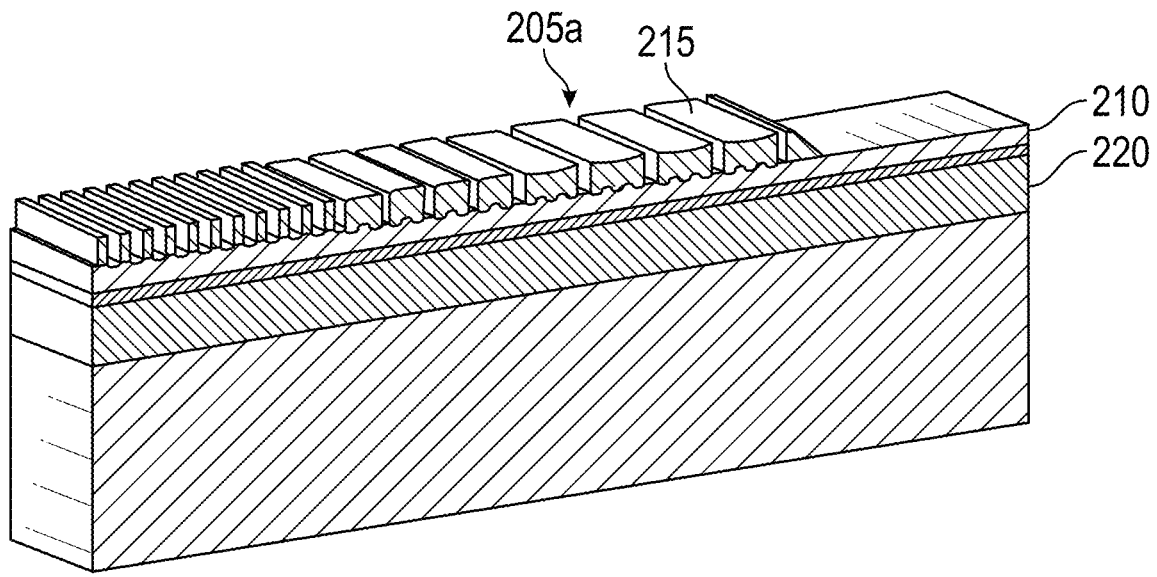
FIG. 2E is a cross-sectional perspective view of a substrate segment showing a planarizing film with a plurality of trench patterns, according to an embodiment of the present disclosure.
Figure 2F:
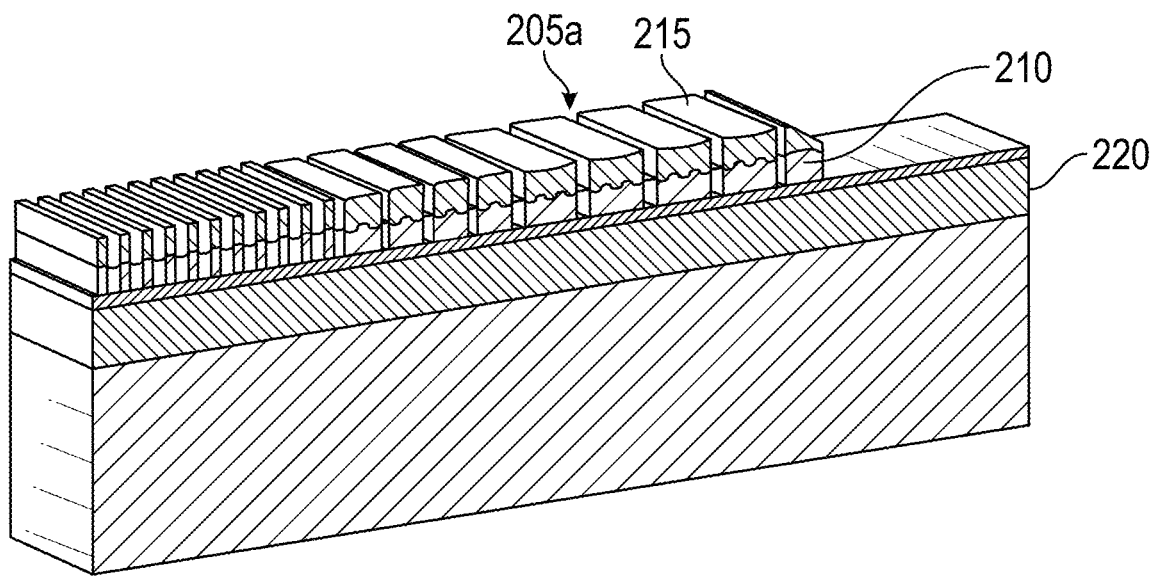
FIG. 2F is a cross-sectional perspective view of a substrate segment showing a plurality of trench patterns transferred into a hard mask, according to an embodiment of the present disclosure.

FIG. 2E shows the planarizing film 215 with the trench patterns 205a, according to an embodiment of the present disclosure. In an embodiment, an ultra low-k (ULK) film 220 is disposed underneath the hard mask 210. FIG. 2F shows the trench patterns 205a transferred into the hard mask 210, according to an embodiment of the present disclosure. During a first transfer etch process for the hard mask 210, the trench patterns 205a within the planarizing film 215 can be transferred into the hard mask 210 before a second transfer etch process transfers the trench patterns 205a into the ULK film 220.

Figure 2G:
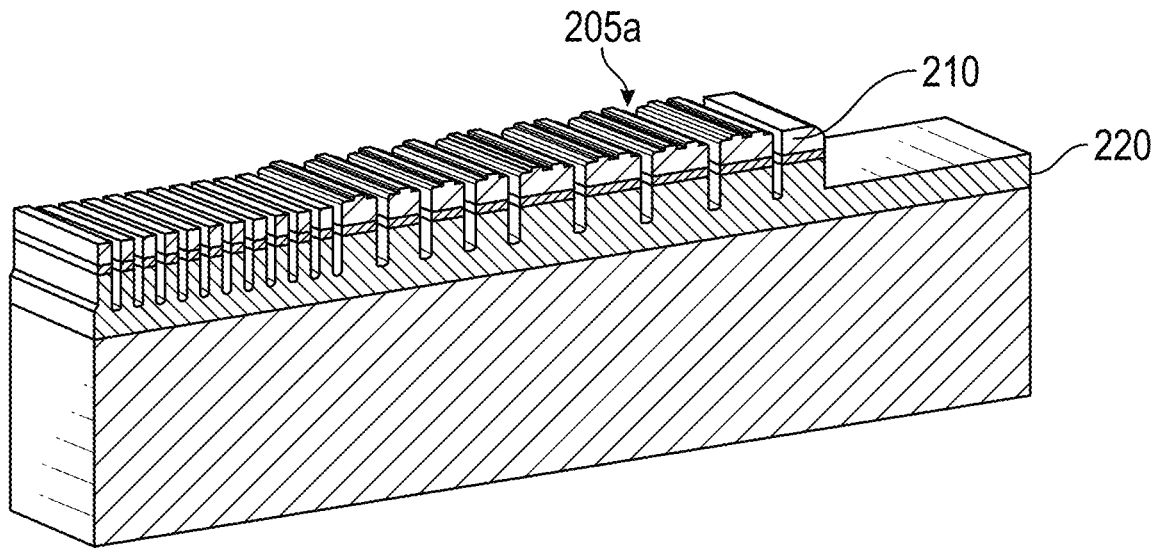
FIG. 2G is a cross-sectional perspective view of a substrate segment showing a plurality of trench patterns transferred into an ultra low-k (ULK) film, according to an embodiment of the present disclosure.

FIG. 2G shows the trench patterns 205a transferred into the ULK film 220, according to an embodiment of the present disclosure. Once trenches are transferred into the hard mask 210, subsequent processes such as block formation and self-aligned via patterning can be performed at this step with this level of topography. The purpose of the planarizing film 215 is to not only contain the trench patterns 205a before transfer to the hard mask 210, but also to protect the hard mask 210 from being etched in the region where there are no trench patterns 205a. Note in FIGS. 2E-2G, the planarizing film 215 has been entirely removed from the right side via the etch-recess, thus during the first transfer etch process, the unprotected right side of the hard mask 210 is etched more as compared to the left side which has remaining planarizing film 215 covering the hard mask 210 at predetermined locations. During the second transfer etch process, the already recessed right side can be etched again, resulting in the right side being recessed down even further.

Figure 2H:
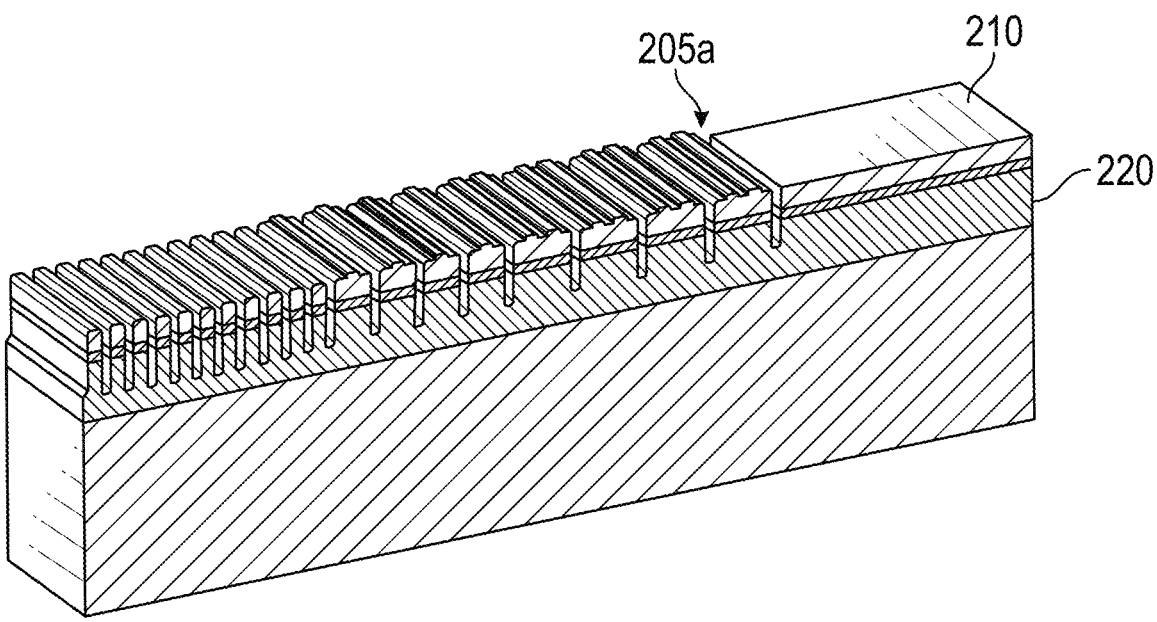
FIG. 2H is a cross-sectional perspective view of a substrate segment showing an intended final pattern of trench patterns being etched into a ULK film, according to an embodiment of the present disclosure.

FIG. 2H shows an intended final pattern of trench patterns 205a being etched into the ULK film 220, according to an embodiment of the present disclosure. In this example, the trenches are first memorized into a TiN hard mask 210 and the trenches transferred into the underlying ULK film 220. Note that on the right side, a region where no trench patterns 205a are memorized into the hard mask 210 is left as an open hard mask 210 field and no hard mask 210 is removed, thus no un-intended trench patterns 205a are patterned in this open hard mask 210 field and subsequently into the ULK film 220, resulting in a more uniform height across the surface.

Techniques herein enable planarizing organic materials that have been deposited via spin-on, vapor deposition, or other method. Techniques include emulating/modelling film deposition for corrective maps, and using spatially selective acid diffusion to planarize a non-planar surface.

Various method steps can be used herein. In one embodiment a spin-on acid-labile film containing a de-crosslinker such as a developable bottom anti-reflective coating (dBARC) or a photoresist film can be deposited on an organic layer. Deposition can be performed either through spin-coating or chemical deposition or other deposition method that does not damage the underlying organic film. Notably, an acid-containing film including a photoacid generator (PAG) or thermal acid generator (TAG) with a transparent or near-transparent polymer can be coated overtop the acid-labile film. Preferably, this acid-containing film is readily removed by common lithographic developer chemistries using a solvent system that will not damage the underlying organic film.

The acid-containing film is configured to generate a predetermined quantity of acid as a function of exposure energy used/received. Acid generated from exposure energy can be diffused down to the acid-labile film underneath and cause either a de-cross-linking reaction within the dBARC film or cause a photo-dissociation reaction for the case of a photoresist film. Thus, the exposure energy directly and locally alters a thickness of the acid-labile film following exposure, thermal diffusion, and chemical development.

A predetermined photoacid generator (PAG) has sensitivity to either a predetermined wavelength or to a predetermined range of wavelengths, thus enabling use of myriad exposure sources. The exposure source can be a lithography stepper/scanner across wavelengths ranging from, for example, 170 nm to 400 nm. The exposure source can also be a direct write system that projects an image or uses a scanning laser, with similar wavelength ranges. The polymer used with the PAG-containing film can be transparent or near-transparent to the predetermined wavelength. Note that a physical lithographic exposure stepper or scanner can be used as well. In another example, a comparably simple scanning laser system can be used that can vary the exposure energy spatially across a surface of a wafer.

In an embodiment, emulating thickness variation can be used for correction processing. Thickness variation (relative or absolute) of a spin-on, CVD-deposited, or physical vapor deposition (PVD)-deposited film over a topography stack can emulated based on a mask file or other starting variable inputs. For example, the emulation may be based on a starting Graphic Database System (GDS) or Open Artwork System Interchange Standard (OASIS) mask file. For example, a mandrel pattern can be extracted from a mask file and emulated through multiple deposition and etch processes in the desired SADP or SAQP process. The emulation can provide a final emulated topography file from which to predict variance of a deposited film across the wafer having predetermined topography based on the (initial) mask file. Thus, the initial mask file at one step in the integration flow can be converted to estimated topography at a subsequent or much-later step in the process flow, and from this emulation a predicted localized, film height variance can be modelled.

In an embodiment, from the final emulated topography file and modelled deposited film variance across the wafer, a correction exposure mask file can be generated to locally produce (by coordinate location) acid to diffuse down to the acid-labile film and cause either the de-crosslinking or de-protection reaction (based on the composition of the acid-labile film). The result is a localized decrease in the absolute film thickness of the acid-labile film.

In an embodiment, the composition of the acid labile film can be similar to the organic film over which it is deposited. That is, from an etch rate and etch selectivity perspective, minimal difference is observed between the etching of the acid-labile film and the underlying organic film. Alternatively, films with different etch selectivities can be used.

In an embodiment, an etch recess process can be executed to recess both the "flattened" (planarized) acid-labile (overcoat) film, as well as the underlying organic film. This recess etch can be executed to achieve a final planar organic film, or to reach a point where an end-point can be detected from the underlying topography, or etched down to a particular point in a cyclic etch process where the film is known to be of adequate final planarity.

In an embodiment, an additional re-coating of the organic film can be executed to yield a more planar surface topography. With a starting point of improved planarity or sufficient planarity, the re-coating results in a more planar film. The second overcoat can also be used to achieve a desired absolute film height target. This is beneficial when using the organic film as part of the anti-reflection film stack in a subsequent lithography process. Re-coating can also achieve further improvement in overall absolute film planarity because the second overcoat is deposited on a relatively planar surface as compared to the initial topography.

As can be appreciated, methods herein can be used with multiple different microfabrication processes. The previous description of the planarization method is further elucidated below with accompanying figures.

Figure 3A:
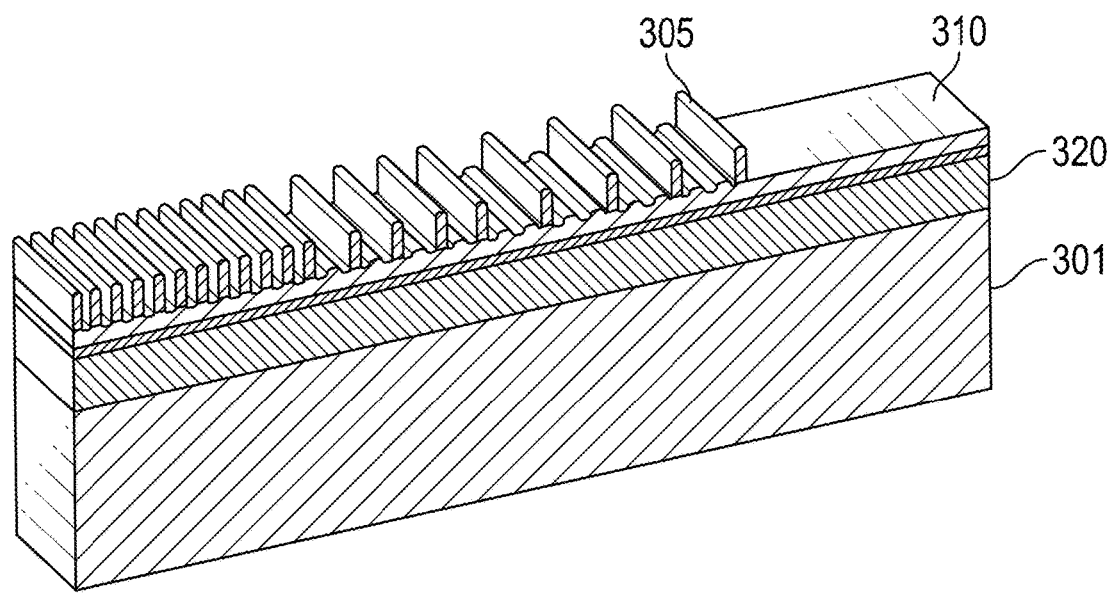
FIG. 3A is a cross-sectional perspective view of a substrate segment showing an initial topography pattern, according to an embodiment of the present disclosure.

FIG. 3A shows an initial topography pattern, according to an embodiment of the present disclosure. In an embodiment, one application of techniques herein is planarizing an organic film for subsequent lithographic processing to minimize any DOF variation in an exposure process. Any of various topographies can be provided on a substrate 301. A plurality of line spacers 305 (herein referred to as "line spacers 305") at varying pitch can be patterned overtop a hard mask 310, for example a TiN film, which can be deposited overtop a ULK film 320. This stack can be similar to those used for back-end-of-line (BEOL) logic applications, for instance.

Figure 3B:
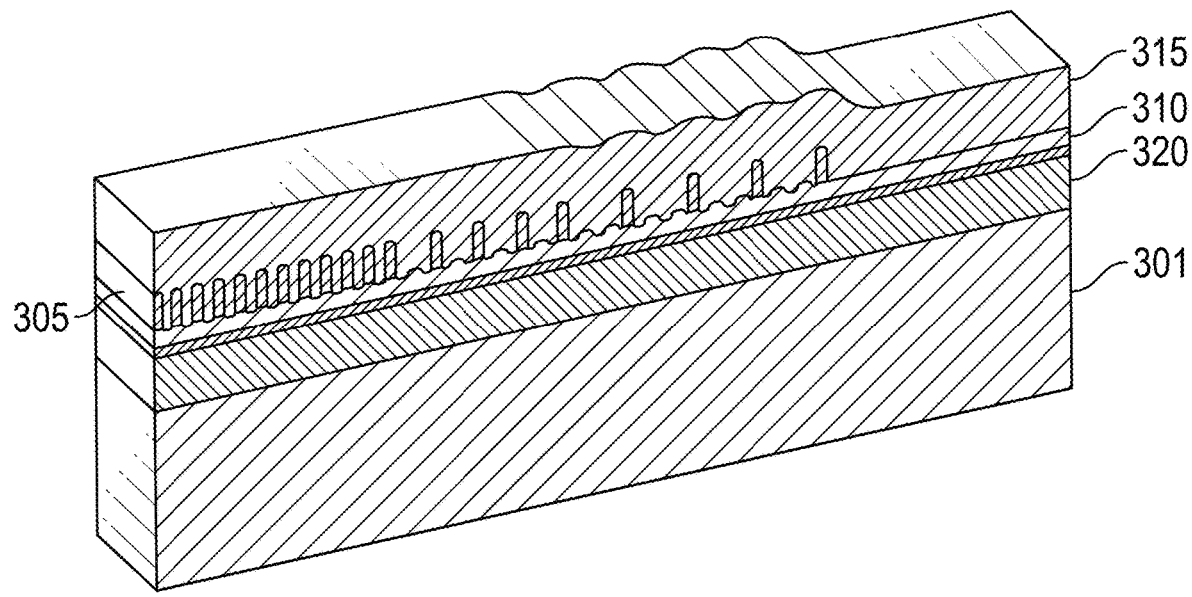
FIG. 3B is a cross-sectional perspective view of a substrate segment showing a coated topography pattern, according to an embodiment of the present disclosure.

FIG. 3B shows a coated topography pattern, according to an embodiment of the present disclosure. In an embodiment, a planarizing film 315 can be coated overtop the line spacers 305 and hard mask 310. The planarizing film 315 can be a CVD-deposited amorphous carbon film or a spin-on organic film chemically tuned to provide absorbance to the predetermined wavelength of light being used in a subsequent exposure process. Notably, the planarizing film 315 can have a non-planar topography (similar to the process from FIGS. 2A to 2G) that can be corrected as described herein. The non-planar topography can include, for example, a step-like decrease in a height of the planarizing film 315 progressing from a higher density of the line spacers 305 (left) to a lower or zero density of the line spacers 305 (right). The planarizing film 315 can be sensitive to acid, wherein an acid can solubilize or de-crosslink portions of the planarizing film 315 in contact with the acid.

Figure 3C:
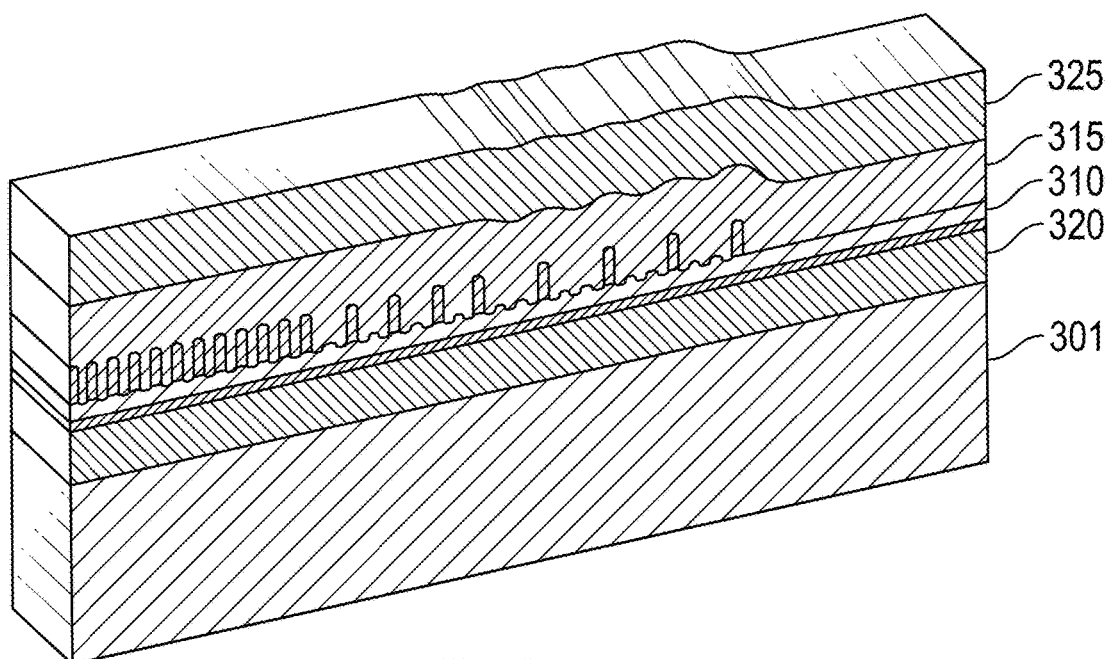
FIG. 3C is a cross-sectional perspective view of a substrate segment showing a planarizing film coated with an acid-labile film, according to an embodiment of the present disclosure.

FIG. 3C shows the planarizing film 315 coated with an acid-labile film 325, according to an embodiment of the present disclosure. In an embodiment, the acid-labile film 325 can be deposited or spin-coated onto the non-planar surface of the planarizing film 315. This acid-labile film 325 can be cross-linked to be insoluble to solvents used in either photoresists or other ancillary photolithographic materials, for example spin-on hard masks or spin-on silicon anti-reflective coating (SiARC) films. The acid-labile film 325 can be acid labile, wherein exposure to acids can trigger a de-crosslinking reaction within the acid-labile film 325. This de-crosslinking reaction can reduce a thickness of the acid-labile film 325 in an area of exposure to the acids when exposed to a predetermined developing chemical, for example tetramethyl ammonium hydroxide (TMAH). Also, the acid-labile film 325 can have a chemical composition similar to that of the planarizing film 315. For example, the acid-labile film 325 can have an Onishi parameter similar to the planarizing film 315 underneath, which would provide a similar etch-rate and selectivity.

In an embodiment, the acid-labile film 325 can be dBARC. The dBARC can generate acid through inclusion of a photoacid generator (PAG) within the acid-labile film 325, in which exposure to the predetermined wavelength of light converts the PAG to a free anion, resulting in the de-crosslinking reaction.

Figure 3D:
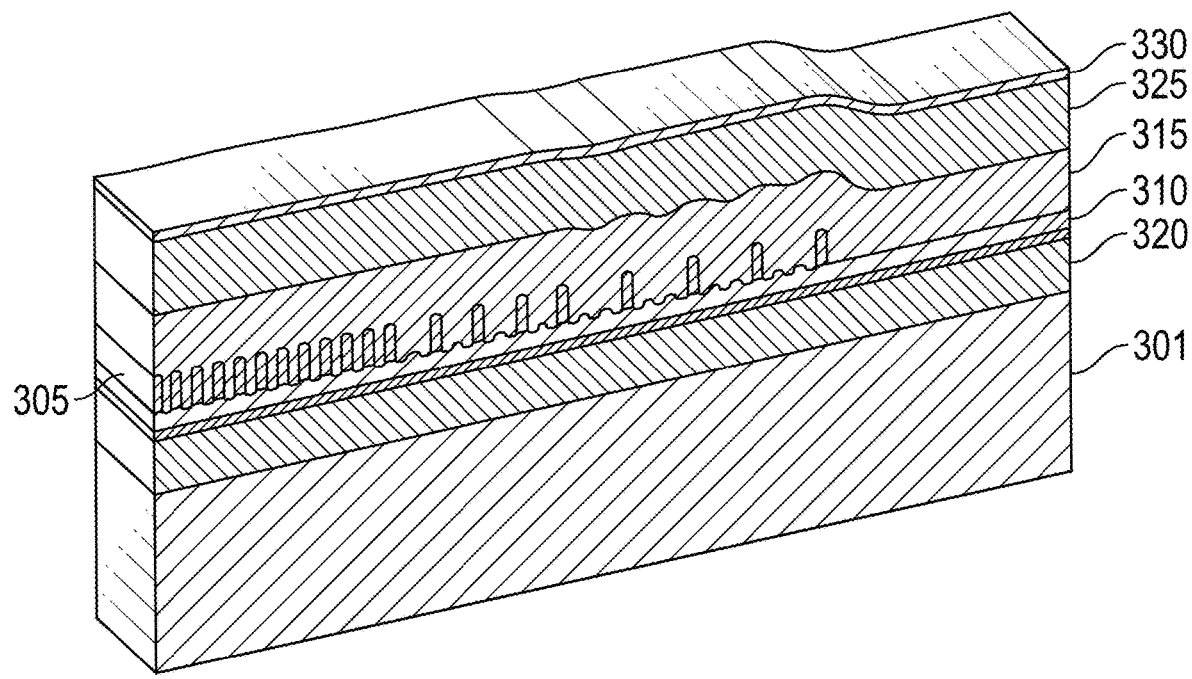
FIG. 3D is a cross-sectional perspective view of a substrate segment showing an acid-labile film coated with an acid source film, according to an embodiment of the present disclosure.

FIG. 3D shows the acid-labile film 325 coated with an acid source film 330, according to an embodiment of the present disclosure. In an embodiment, a particular dBARC can be selected that does not include a PAG designed into the formulation. Instead, the material can include a de-crosslinker that is acid sensitive. An acid source for the acid-labile film 325 can be provided by the acid source film 330 deposited on the acid-labile film 325. The acid source film 330 can include the PAG that can be utilized as a localized acid source to selectively de-crosslink localized areas of the underlying acid-labile film 325.

A chemical composition of the acid source film 330 can be optically transparent to light being used in conjunction with the sensitivity of the PAG. A photosensitive response can include dissociating an anion and cation in the PAG, thus producing a free acid which can then react with the de-crosslinker in the acid-labile film 325 applied overtop the planarizing film 315. The acid source film 330 can include a resin or polymer transparent to the predetermined wavelength in which the PAG can be intermixed within and equally distributed to ensure that a consistent film of a consistent thickness can be deposited on top of the acid-labile film 325. After dissociation of the anion and cation from the PAG, diffusion of the acid through the acid-labile film 325 can be controlled based on selected properties of the acid-labile film 325.

Figure 5A:
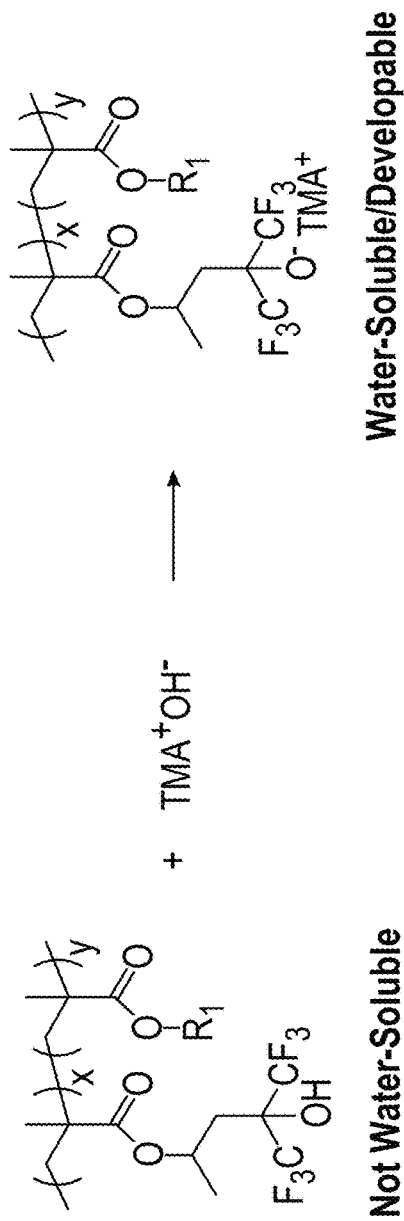
FIG. 5A shows structural formulas of an example resin system, according to an embodiment of the present disclosure.

The acid source film 330 can include a solvent system that will not damage the underlying acid-labile film 325, and the acid source film 330 can be very soluble itself in either aqueous or commonly used developer chemistries used in photolithography, for example TMAH. The predetermined range of wavelengths for semiconductor device fabrication can be, for example, 170 nm to 400 nm, though wavelengths outside of this range can also be used. By way of a specific example, the acid source film 330 can include a fluorinated alcohol-based methacrylate polymer in a solvent co-system composed of methyl isobutyl carbinol and propylene glycol methyl ether acetate. The example resin system is shown in FIG. 5A and is transparent at 193 nm exposure wavelength, according to an embodiment of the present disclosure.

Figure 5B:
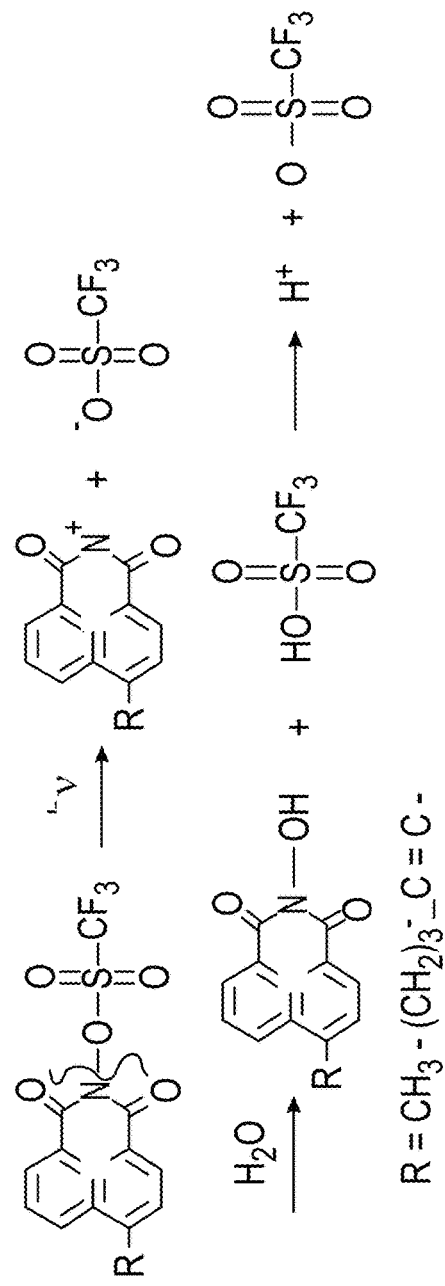
FIG. 5B shows structural formulas of an acid generation mechanism for a PAG, according to an embodiment of the present disclosure.

PAG selection can be determined by the predetermined wavelength of exposure to be used to generate the local acid. Notably, higher exposure energy/lower predetermined wavelength exposures can have improved resolution and thus tighter control on localized generation of the photoacid but with higher wafer/pass costs. Additionally, a given anion type can be determined based on desired vertical diffusion in contrast to lateral diffusion through the acid-labile film 325 in order to minimize an amount of chemically-induced blur that results from the exposure process. Limiting the PAG anion to be triflate-based can be beneficial since lower fluorine content in the PAG anion can drive more vertical diffusion profiles. In contrast, using higher fluorine content in the anion, such as nanoflates and perfluorooctane sulfonate (PFOS), can drive more lateral diffusion profiles. The acid generation mechanism for such a triflate-based PAG is shown in FIG. 5B, according to an embodiment of the present disclosure.

Figure 3E:
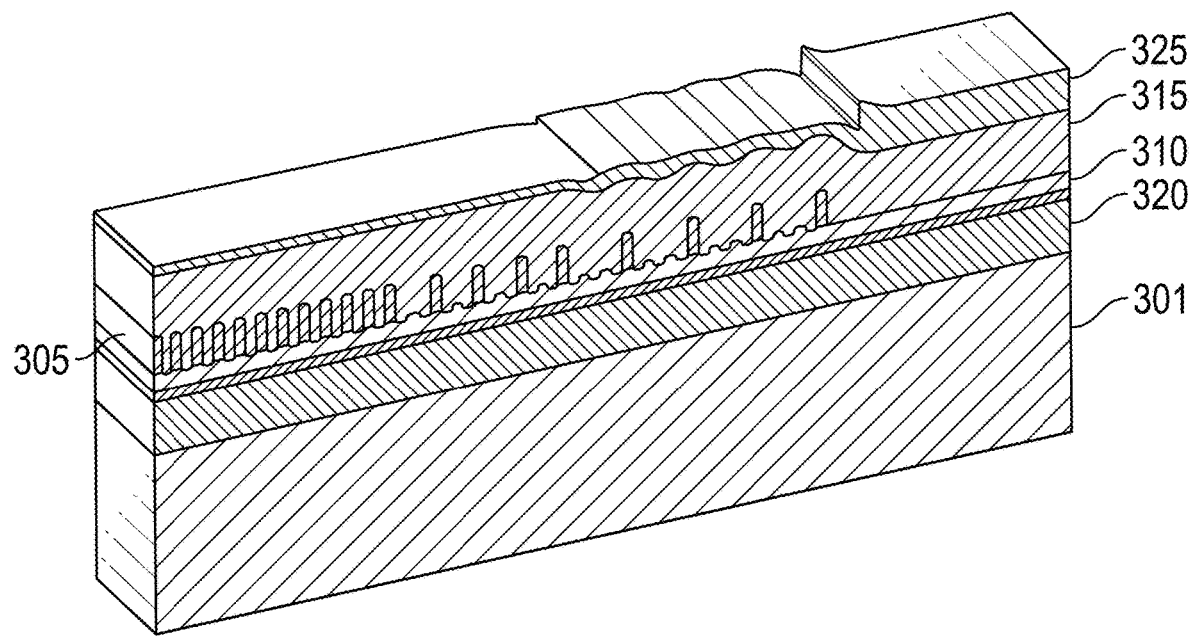
FIG. 3E is a cross-sectional perspective view of a substrate segment showing correction of an acid-labile film through photoactivation of a photo acid generator (PAG), according to an embodiment of the present disclosure.

FIG. 3E shows correction of the acid-labile film 325 through photoactivation of the PAG, according to an embodiment of the present disclosure. The acid-labile film 325 and the acid source film 330 can then be sent through the exposure process in which the predetermined quantity of acid can be locally generated by means of a photomask or direct-write system that can control the quantity of transmission locally at each point on the wafer. The predetermined quantity of acid can have a direct effect on the underlying acid-labile film 325 such that an amount of de-crosslinked polymer in the acid-labile film 325 can be in direct proportion to amount of acid generated in the acid source film 330 above. Upon application of a reaction process (e.g. a reaction thermal process), the de-crosslinked polymer in the acid-labile film 325 can become soluble in developer chemistries used in lithography, for example TMAH. During this development step, the acid source film 330 can also be removed, thus providing a clear path for development of the acid-labile film 325. In this manner, any non-planarity in the planarizing film 315 can be countered by an inverse in the post-developed acid-labile film 325 as shown in FIG. 3E.

Upon exposure that varies in exposure dose by coordinate location on the substrate 301, the acid is generated in different concentrations across the pattern density. For example, a graded photomask can be used that is tuned specific to an expected pattern density profile. In areas with higher underlying pattern density and corresponding higher film heights, relatively more acid can be generated. Likewise, in areas with lesser or no underlying pattern density with corresponding lower film heights, relatively less acid can be generated. On the right side of FIG. 3E, note the post-developed profile of the remaining acid-labile film after graded exposure, bake, and TMAH development shows an overall profile of the initial planarizing film 315 with the remaining acid-labile film 325 producing a relatively more planar topography across the surface. Although non-uniform edges can be produced that correlate to a difference in the exposure energy used in the photomasking process, the non-uniform edges can be smoothed further if desired as described herein.

Figure 3F:
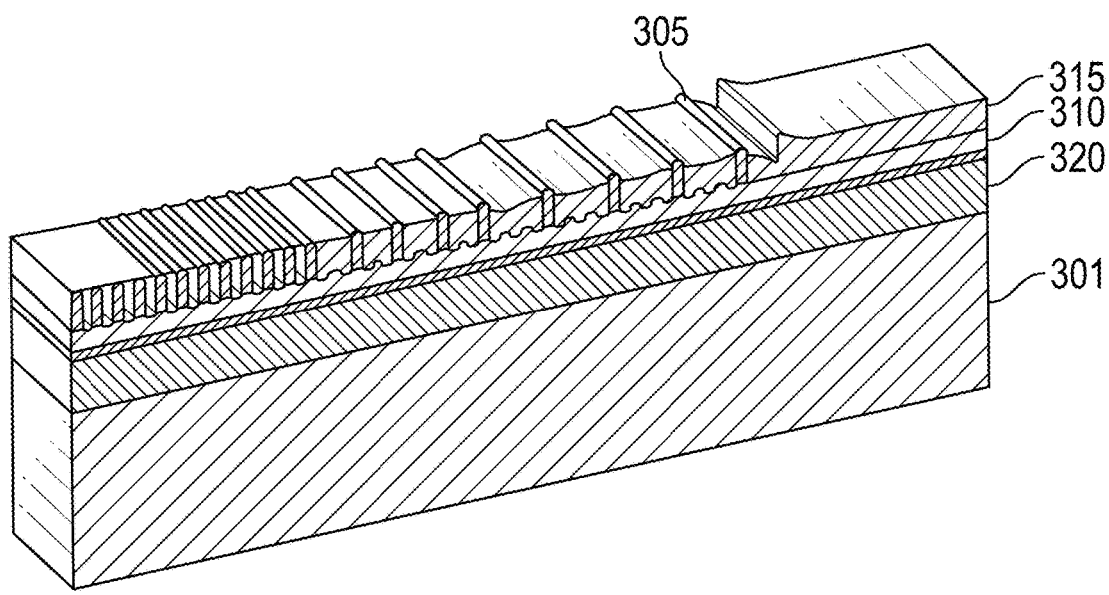
FIG. 3F is a cross-sectional perspective view of a substrate segment showing an etch recessed planarizing film, according to an embodiment of the present disclosure.

FIG. 3F shows an etch recessed planarizing film 315, according to an embodiment of the present disclosure. In an embodiment, a developed acid-labile film 325, having similar Onishi parameter to the planarizing film 315 underneath, and having a better range of planarization compared to the planarizing film 315 underneath, can then be etch recessed with an end-point to the top of the line spacers 305. With etch rates matched, when tops of underlying line spacers 305 are reached, the etch recess can be stopped with sufficient coverage through the patterned line spacers 305 areas and areas without line spacers 305.

Figure 3G:
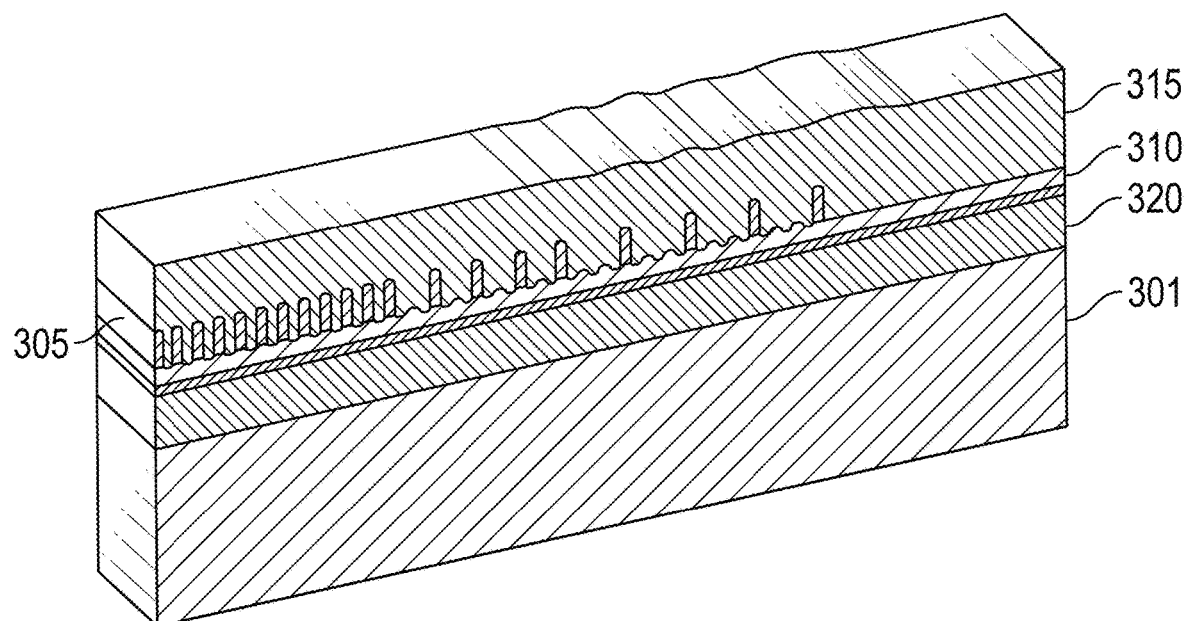
FIG. 3G is a cross-sectional perspective view of a substrate segment showing a planarizing film re-coated with additional planarizing film, according to an embodiment of the present disclosure.

In another embodiment, the underlying topography or structures may not need to be altered. In this embodiment, once a recess of the planarizing film 315 reaches the top of the underlying line spacers 305, all of the acid-labile film 325 can be etched or removed. This enables re-deposition of the planarizing film 315 overtop the etch-recessed planarizing film 315. Since the etch recessed planarizing film 315 already has improved planarization compared to the starting topography, further coating of the planarizing film 315 can yield a film that is yet more planar, as illustrated in FIG. 3G, according to an embodiment of the present disclosure. Depending on materials selected, an initial non-planarity of almost, for example, 50 nm of a 100 nm planarizing film can be reduced to below 10 nm (80% improvement). Other materials and exposure parameters (for example, resolution of exposure) can have even greater improvements in planarity.

Figure 3H:
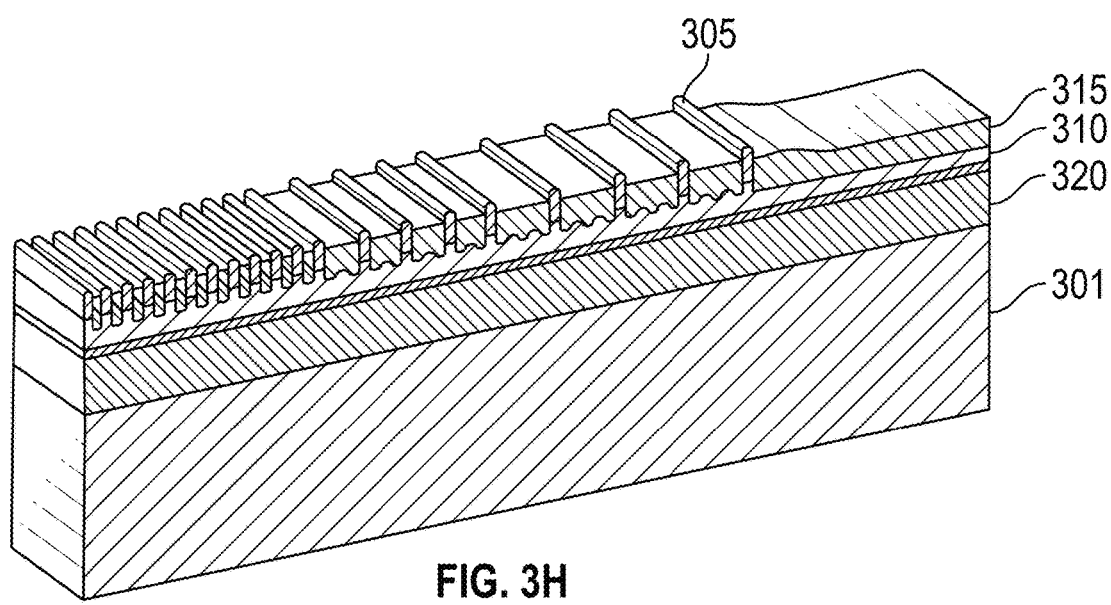
FIG. 3H is a cross-sectional perspective view of a substrate segment showing recess of a planarizing film to uncover line spacers, according to an embodiment of the present disclosure.

FIG. 3H shows recess of the planarizing film 315 to uncover the line spacers 305, according to an embodiment of the present disclosure. In an embodiment, the planarizing film 315 can then be recessed again by etching or blanket-exposed recess to reveal the tops of the line spacers 305 which will be subsequently exhumed in the process. Note that such recesses can have some margin of over-etch to ensure that all the intended line spacers 305 are opened and accessible for exhumation, otherwise the process would leave a residual spacer and prevent the formation of a tone-inversed trench.

Figure 3I:
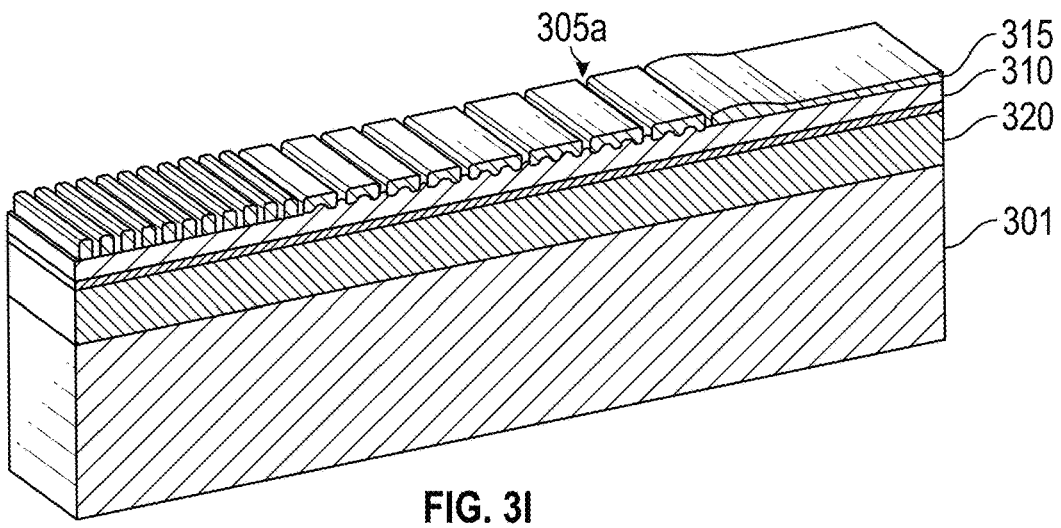
FIG. 3I is a cross-sectional perspective view of a substrate segment showing a planarizing film with trench patterns, according to an embodiment of the present disclosure.

FIG. 3I shows the planarizing film 315 with the trench patterns 305a, according to an embodiment of the present disclosure. Once the line spacers 305 are uncovered, the line spacers 305 can be exhumed through an etch process to tone-invert the line spacer 305 pattern to a plurality of trench patterns 305a (herein referred to as "trench patterns 305a") contained within the remaining planarizing film 315.

Figure 3J:
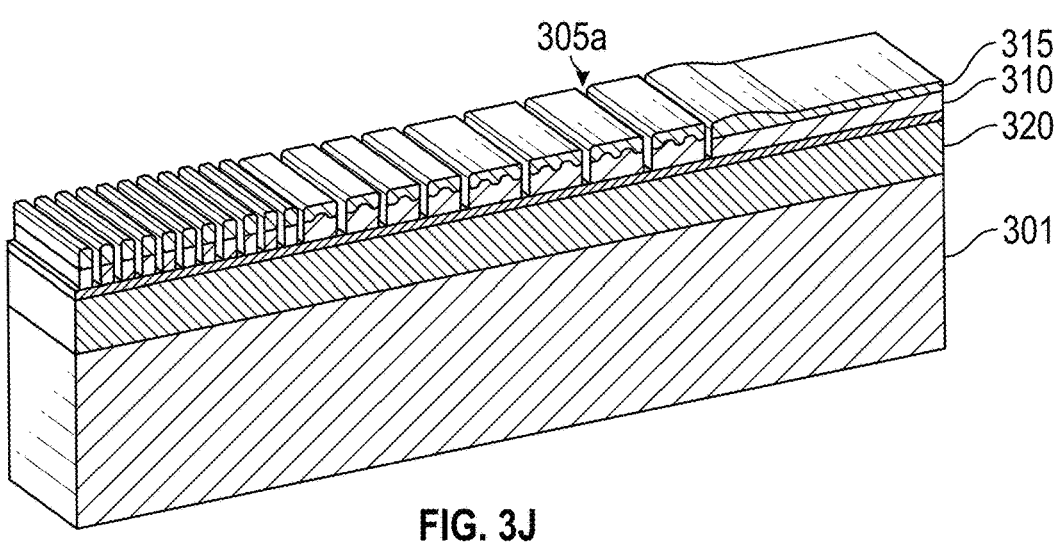
FIG. 3J is a cross-sectional perspective view of a substrate segment showing trench patterns transferred into a hard mask, according to an embodiment of the present disclosure.
Figure 3K:
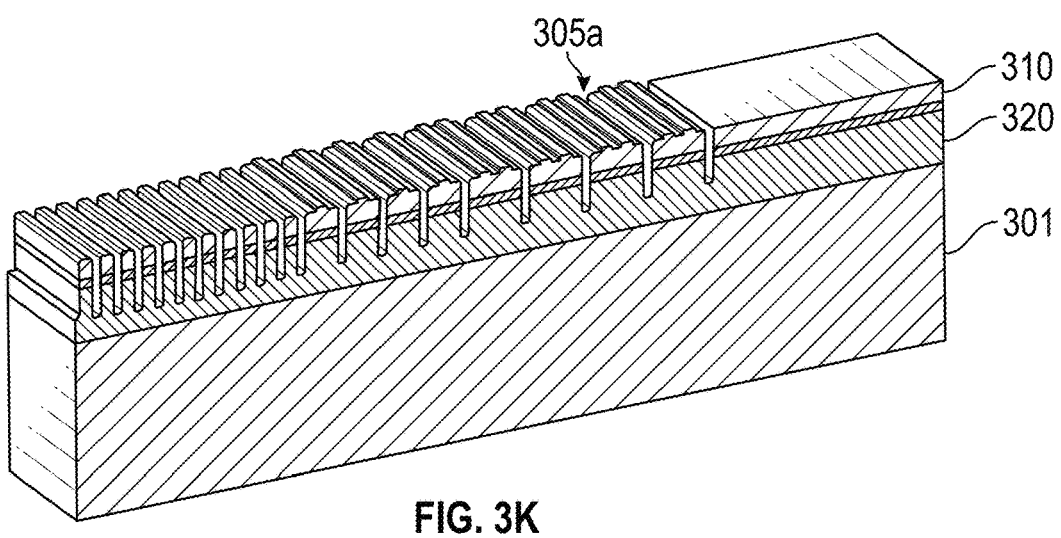
FIG. 3K is a cross-sectional perspective view of a substrate segment showing trench patterns transferred into a ULK film, according to an embodiment of the present disclosure.

FIG. 3J shows the trench patterns 305a transferred into the hard mask 310, according to an embodiment of the present disclosure. FIG. 3K shows the trench patterns 305a transferred into the ULK film 320, according to an embodiment of the present disclosure. During a first transfer etch process for the hard mask 310, the trench patterns 305a within the planarizing film 315 can be transferred into the hard mask 310 before a second transfer etch process transfers the trench patterns 305a into the ULK film 320. This technique is very beneficial because the hard mask 310 is protected during the trench patterns 305a transfer etch in the non-patterned areas through ensuring that a sufficient thickness of the planarizing film 315 or the acid-labile film 325 is overtop the area that had no initial topography/structures. Accordingly, no unintended trenches are patterned in the area of hard mask 310 and ULK film 320 where no trenches were desired.

Techniques herein include a photomasking process to generate correction images to expose on substrates. Such photomask generation can include emulation techniques. Using emulation techniques can improve process times as compared to measuring and mapping topographies with metrology tools.

Figure 4A:
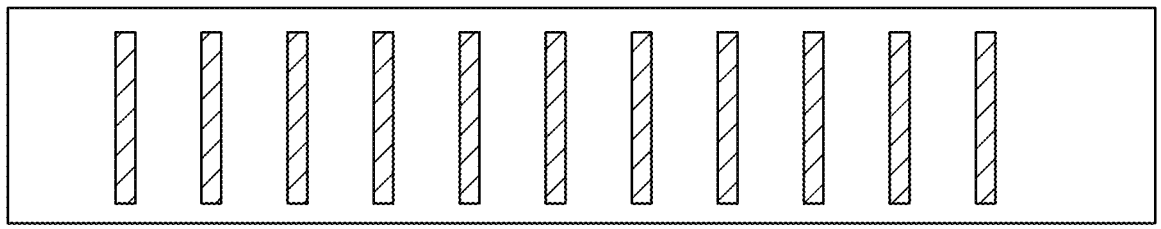
FIG. 4A is a top view of a substrate segment showing a simplified clip or section of mandrels to be used in an exposure process, according to an embodiment of the present disclosure.

FIG. 4A shows a simplified clip or section of mandrels to be used in an exposure process, according to an embodiment of the present disclosure. In an embodiment, an initial mask file, for example a GDS or OASIS mask file, can be used to quantitatively map the initial lithography process, which will indirectly define the topography.

Figure 4B:
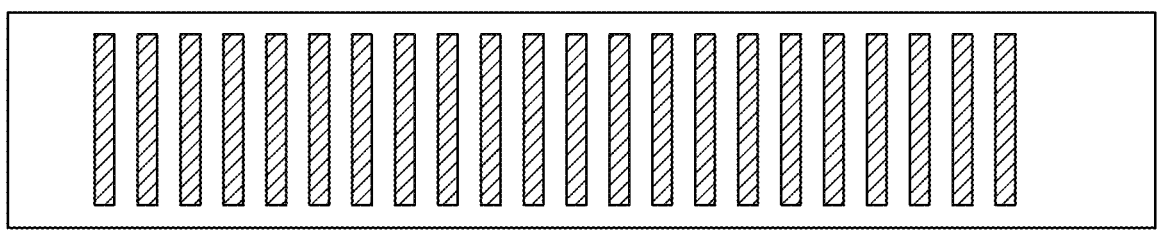
FIG. 4B is a top view of a substrate segment showing emulation of self-aligned double patterning (SADP) structures based on a mandrel clip, according to an embodiment of the present disclosure.

FIG. 4B shows emulation of SADP structures based on a mandrel clip, according to an embodiment of the present disclosure. Emulation software, for example Synopsys Process Explorer or Coventor SEMulator3D, can be used to then emulate what a spacer pattern will look like after spacer open/mandrel pull etches and to incorporate results back to the mask file. For example, this emulation can be converted back to GDS or OASIS files.

Figure 4C:
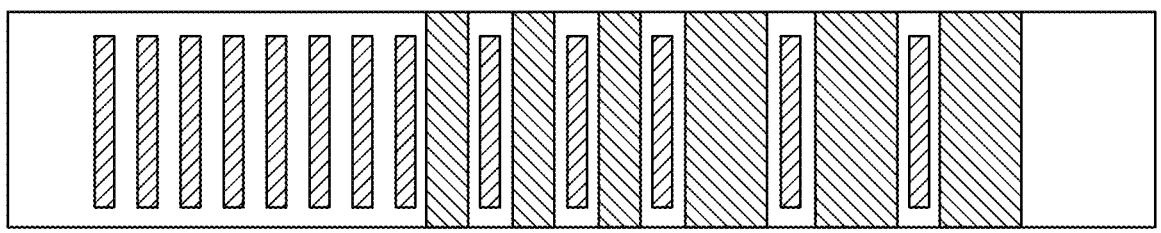
FIG. 4C is a top view of a substrate segment showing emulation of additional masks on module level processes, according to an embodiment of the present disclosure.

Any lithography steps which intend to cut any of the patterned spacer (e.g. line spacers 305) can then be further emulated in order to produce a final topography map. FIG. 4C shows emulation of additional masks on module level processes, according to an embodiment of the present disclosure. The module level processes can include, for example, spacer cuts or blocks. From the final topography map, the emulation software can be used to calculate the heights of the planarizing film 315 overtop the provided emulated topography.

Emulation software such as Synopsys Process Explorer or Coventor SEMulator3D can then be used to predict the thickness variation of the planarizing film 315 based on the topography and material and deposition processes which have been well correlated to silicon data for said films and processes.

Figure 4D:
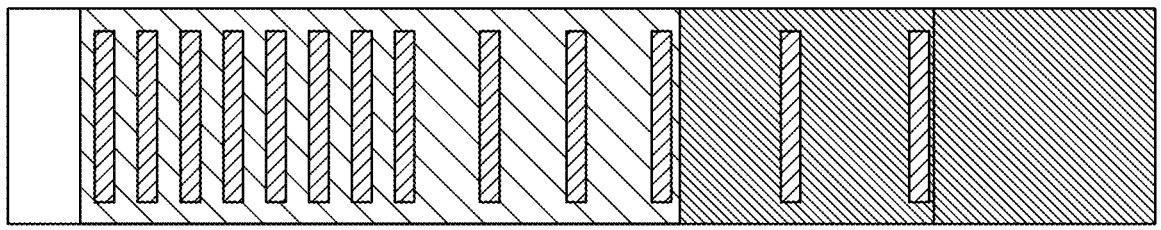
FIG. 4D is a top view of a substrate segment showing an example final exposure mask for an acid-labile film, according to an embodiment of the present disclosure.

FIG. 4D shows an example final exposure mask for the acid-labile film 325, according to an embodiment of the present disclosure. A conjugate mask can then be created in the mask files in which a set exposure gradient or exposure energy can be delivered to specific portions of the pattern in order to produce an overall film height of the planarizing film 315 and the acid-labile film 325 to be as planar as possible. This conjugate mask can represent a substrate 301 signature at a given point in a fabrication process flow. This substrate 301 signature can then be used to create a correction mask or image for exposure on the substrate for targeted acid generation by coordinate location on the substrate 301. For example, the left side of FIG. 4D can receive relatively more exposure radiation, while the middle segment receives relatively moderate exposure radiation, and while the right side receives little or no exposure radiation.

Figure 3L:
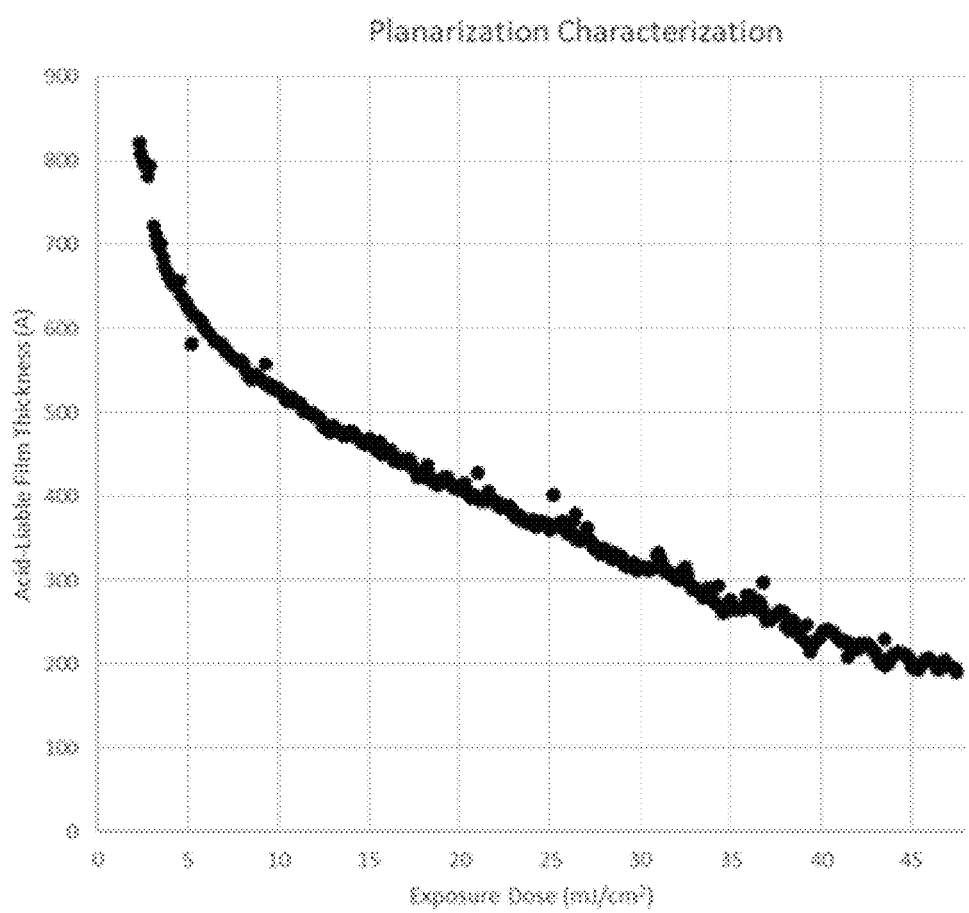
FIG. 3L is a plot showing an example control range for reduction of film thickness, according to an embodiment of the present disclosure.

FIG. 3L shows an example control range for reduction of film thickness, according to an embodiment of the present disclosure. The energy to be delivered in each of these areas can be determined through silicon verification and can be dependent on the formulations used for the acid-labile film 325 as well as the acid source film 330 as shown in FIG. 3L, as an example. The acid source film 330 can be loaded with PAG levels that are in-line with what would be an appropriate control range for the reduction of the acid-labile film 325 through acid diffusion. Such an example of this work for a given PAG is shown in the FIG. 3L. Linear control ranges for reduction of the thickness of the acid-labile film 325 as a function of exposure energy is shown at 193 nm wavelength and initial PAG loading in the acid source film 330. It can be beneficial to ensure that the control range is linear within the thickness variance range being considered and that the exposure energy is within a predetermined optimized range.

The emulation function is beneficial to planarization control methodology because only actual mask files may be accessed to base topography estimations on. Through incorporation of the emulation software, a masked wafer can be run through multiple process steps in a multiple-processing patterning module to derive an actual final pattern which will be on the wafer directly before depositing the planarizing film 315. Thus, any corrections modeled in a separate exposure process can be based on the emulated topography which can itself be converted over to mask files for easy conversion of the how the exposure pattern should look to planarize the acid-labile film 325 using exposure energy In an embodiment, incorporating "dummy" or "assist" structures in the underlying topography can limit the extreme transition areas of the underlying pattern. These assist structures in this case can be simple spacers which are not part of the active pattern in the clear-out areas, or they can be formed by separate exposure in which a dummy or assist pattern can be transferred in the opened pattern areas to an underlying organic layer, where the remaining assist or dummy pattern would be of similar composition to the planarizing film to be used. Thus, the dummy structures used in this manner can be incorporated into the planarizing film in the process.

In another embodiment herein, instead of leaving a planar film for lithographic purposes, planarization herein is used for an anti-spacer or negative-tone spacer process to produce a series of narrow trenches that we could otherwise not be patterned through a single exposure lithographic process.

A starting point can be again where the line spacers 305 are patterned overtop the hard mask 310 which is overtop the ULK film 320 in a typical BEOL logic module. Notably, in this embodiment, the acid-labile film 325 can be deposited directly overtop the topography to produce the familiar step-height variance in absolute film thickness around the interface of the underlying line spacers 305 pattern transitioning from a semi-dense pattern to no pattern-fill at all (left to right). Thus, the following description is similar to the aforementioned embodiment description and FIGS. 3A to 3F, but the deposition of the planarizing film 315 can be skipped.

The acid source film 330 can be coated overtop the acid-labile film 325, or in the case of a photosensitive film being used in place of the acid-labile film 325 (an i-line photoresist film, for example), no acid source film 330 is required overtop. For the example, herein, the acid-labile film 325 does not have an integrated PAG system and is dependent on the acid to be supplied by the overlying acid source film 330. After localized exposure, activation of the acid, de-crosslinking, and developing, the acid-labile film 325 can be significantly planarized. The acid-labile film 325 can be further recessed by, for example, the etch recess process, or further exposure and acid diffusion.

A recess by acid-diffusion can be increased by increasing exposure energy to go down toward the top of the topography, or an additional etch recess can be employed to achieve the desired level of recess. After the recess is completed, more acid-labile film 325 can be re-coated overtop the recessed acid-labile film 325 in order to further improve the absolute planarization of the acid-labile film 325. The benefit of adding this step in the process is to invert any "dip" in the profile resulting from transition between any patterned filled area of the topography to a cleared out area with no topography so that the hard mask 310 is always protected in subsequent spacer-pull operation in the anti-spacer or negative-tone spacer process.

An etch recess of the acid-labile film 325 can be performed to uncover the line spacers 305. In an embodiment, the acid-labile film 325 can then be recessed again by etching or blanket-exposed recess to reveal the tops of the line spacers 305 which will be subsequently exhumed in the process. Note that such recesses can have some margin of over-etch to ensure that all the intended line spacers 305 are opened and accessible for exhumation, otherwise the process would leave a residual spacer and prevent the formation of a tone-inversed trench.

Once the line spacers 305 are uncovered, the line spacers 305 can be exhumed through an etch process to tone-invert the line spacer 305 pattern to a plurality of trench patterns 305a contained within the remaining acid-labile film 325.

During a first transfer etch process for the hard mask 310, the trench patterns 305a within the acid-labile film 325 can be transferred into the hard mask 310 before a second transfer etch process transfers the trench patterns 305a into the ULK film 320. This technique is very beneficial because the hard mask 310 is protected during the trench patterns 305a transfer etch in the non-patterned areas through ensuring that a sufficient thickness of the acid-labile film 325 is overtop the area that had no initial topography/structures. Accordingly, no unintended trenches are patterned in the area of hard mask 310 and ULK film 320 where no trenches were desired.

Another embodiment includes a method of planarizing a substrate. Mask layout data is accessed that defines an initial lithographic pattern to be exposed on a substrate to result in a first topographic pattern. For example, an OASIS or GDS II file is accessed. First microfabrication processing is emulated on a first model of the first topographic pattern resulting in a second model of a second topographic pattern. The second topographic pattern includes structures with reduced pitch as compared to structures from the first topographic pattern. In other words, a mask pattern is used to model what structures will look like on the substrate after developing a latent pattern or after transferring a topographic photoresist pattern into an underlying layer.

Second microfabrication processing is emulated on the second model of the second topographic pattern resulting in a third model having an overcoat deposited on the second topographic pattern. The third model of the overcoat includes predicting z-height values of the overcoat across the substrate. In other words, after the initial pattern of structures is modeled, one or more overcoats deposited thereon are modeled to be able to identify relative or absolute heights of the modeled film based on location on the substrate.

Correction mask layout data is generated based on the predicted z-height values of the overcoat. For example, this correction data can be in the form of an OASIS or GDS II file. Thus, instead of measuring a substrate to create a map of height differences across the substrate, a map of predicted z-height values is created from modeling film deposition, and then correction data can be generated. For example, correction data can identify how much film should be removed at each coordinate location on the substrate to result in a film height that is generally planar, or that has less z-height differences as compared to the initially deposited film.

The substrate is processed according to the first microfabrication processing and according to the second microfabrication processing, resulting in the overcoat deposited on the second topographic pattern. In other words, physical processing steps are executed such as creating a mask pattern, transferring a pattern by etching, depositing films, et cetera. Each of the first microfabrication processing and the second microfabrication processing can include multiple processing steps or treatments.

A pattern of exposure radiation is projected onto the substrate. The pattern of exposure radiation is a z-height modification pattern based on the correction mask layout data. For example, the z-height modification pattern can indicate how much exposure radiation to expose at given point locations across the substrate to affect a desired height reduction at those given point locations by acid generation and diffusion to create soluble top portions of the overcoat. These soluble top portions can then be removed using a developing agent. The overcoat itself can contain an acid generator compound, or a generator compound can be deposited on the overcoat. Processing can continue either by processing structures uncovered after removing soluble top portions, or an additional overcoat.

Accordingly, techniques herein provide accurate and economical planarizing processes using modelling and top-down acid diffusion that is spatially controlled.

Figure 6:
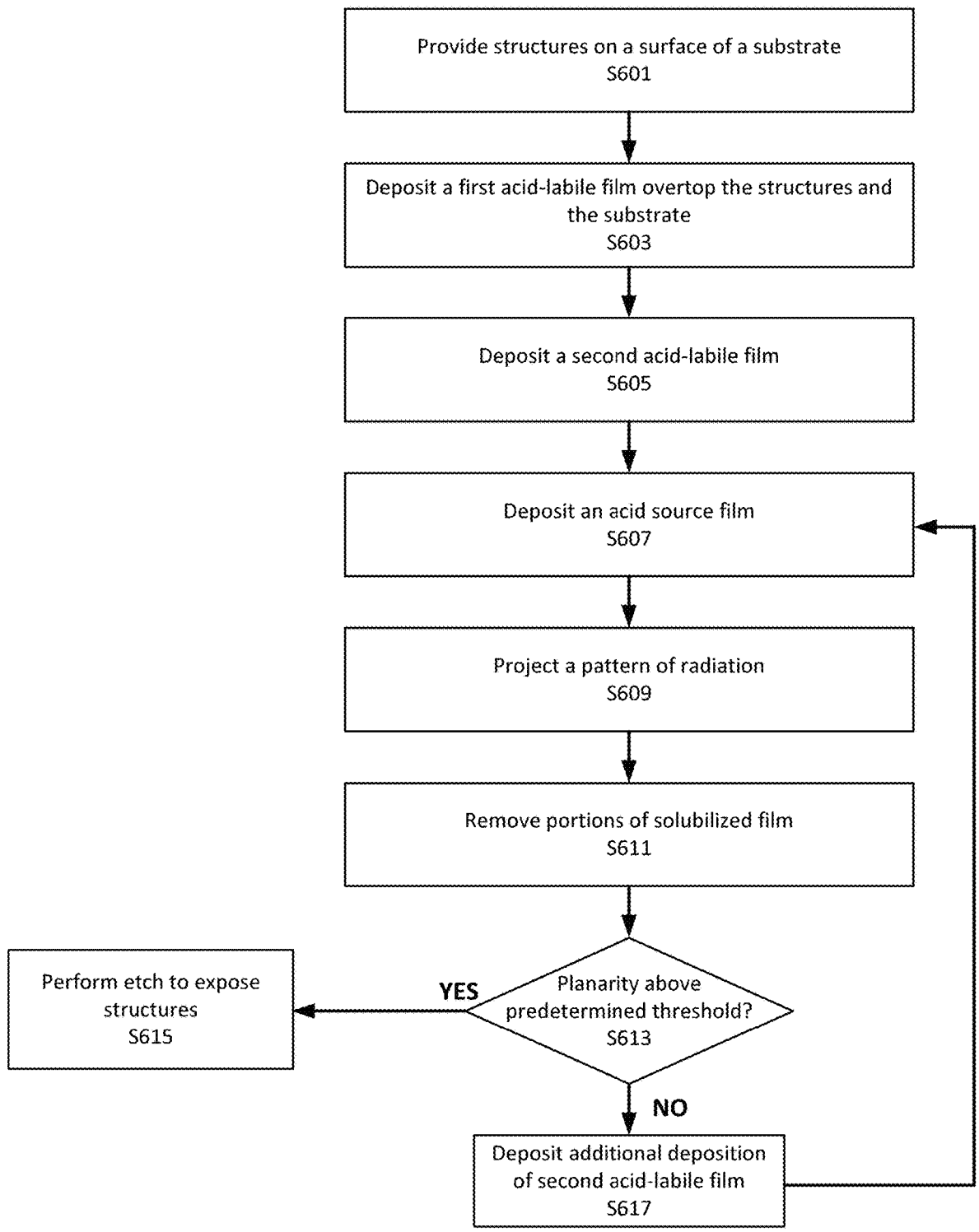
FIG. 6 is a flow chart for showing a method of planarizing films, according to an embodiment of the present disclosure.

FIG. 6 shows a flow chart for a method of planarizing films 600, according to an embodiment of the present disclosure. In step S601, the line spacers 305 are provided on the surface of the substrate 301. In step S603, the planarizing film 315 is deposited overtop the line spacers 305 and the substrate 301. Notably, the planarizing film 315 can be an acid-labile material. In step S605, the acid-labile film 325 is deposited over the planarizing film 315. In step S607, the acid source film 330 is deposited over the acid-labile film 325. In step S609, the pattern of radiation is projected over the acid source film 330 to solubilize the acid from the PAG and diffuse the acid into the acid-labile film 325. In step S611, portions of the acid-labile film 325 that were solubilized by the acid are removed by a removal fluid, such as developer. In step S613, the planarity of the acid-labile film 325 can be determined after removal of the solubilized portions of the acid-labile film 325. In step S615, in response to determining the planarity of the acid-labile film 325 is above a predetermined threshold, the predetermined threshold being determined by the height of the line spacers 305, the acid-labile film 325 is recessed, for example, to expose the top of the line spacers 305. In step S617, in response to determining the planarity of the acid-labile film 325 is below the predetermined threshold, a second deposition of the acid-labile film 325 can be deposited overtop the acid-labile film 325 after removing the portions of the acid-labile film 325 solubilized by the acid. Subsequently, the process of depositing the acid source film 330, projecting the pattern of radiation, and removing the solubilized portions of the acid-labile film 325 can be repeated.

Figure 7:
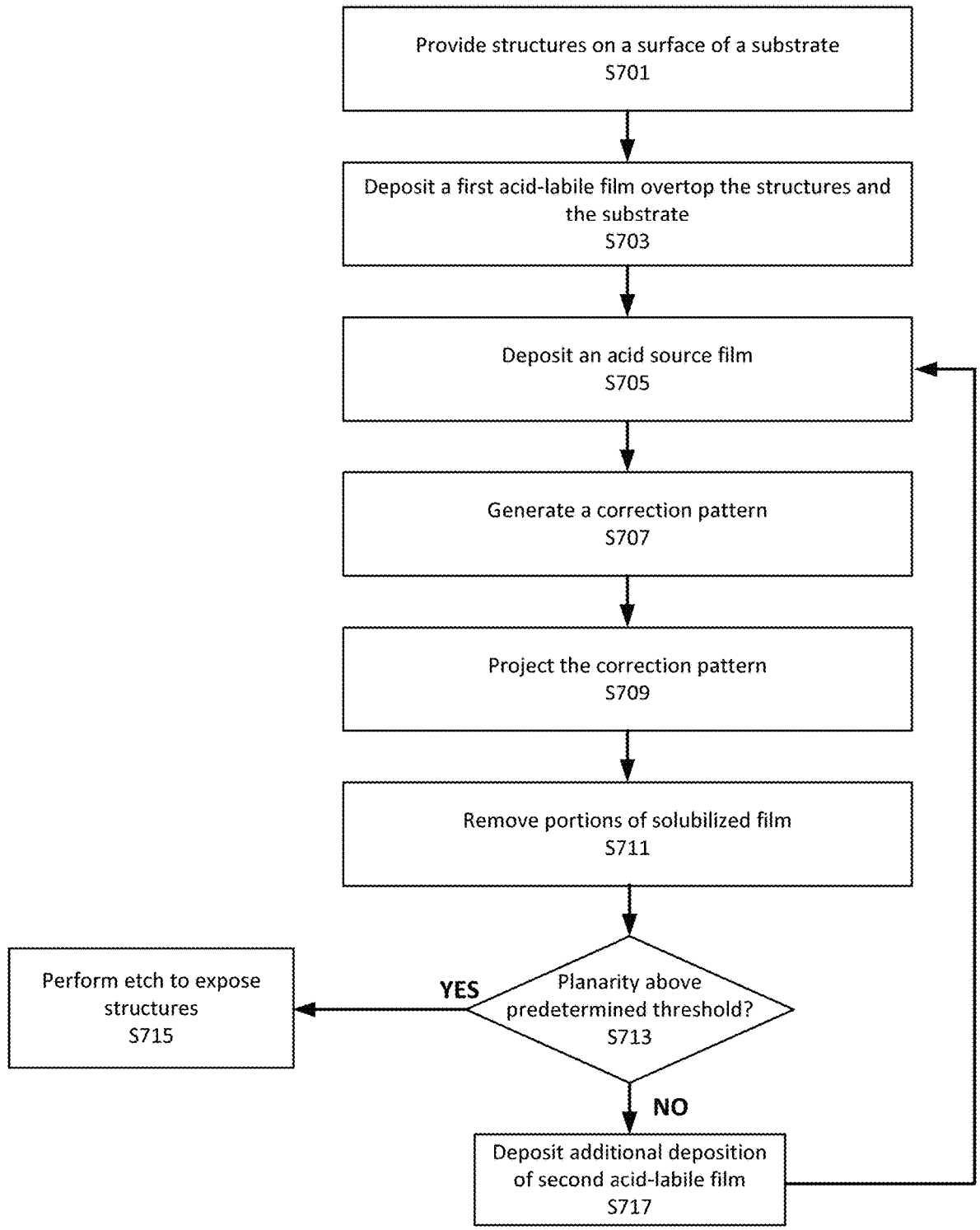
FIG. 7 is a flow chart for showing a method of planarizing films, according to an embodiment of the present disclosure.

FIG. 7 shows a flow chart for a method of planarizing films 700, according to an embodiment of the present disclosure. In step S701, the line spacers 305 are provided on the surface of the substrate 301. In step S703, the acid-labile film 325 is deposited overtop the line spacers 305 and the substrate 301. In step S705, the acid source film 330 is deposited over the acid-labile film 325. In step S707, a correction pattern of radiation is generated based on the topology of the acid-labile film 325. In step S709, the correction pattern of radiation is projected over the acid source film 330 to solubilize the acid from the PAG and diffuse the acid into the acid-labile film 325. In step S709, portions of the acid-labile film 325 that were solubilized by the acid are removed by a removal fluid, such as developer. In step S713, the planarity of the acid-labile film 325 can be determined after removal of the solubilized portions of the acid-labile film 325. In step S715, in response to determining the planarity of the acid-labile film 325 is above a predetermined threshold, the predetermined threshold being determined by the height of the line spacers 305, the acid-labile film 325 is recessed, for example, to expose the top of the line spacers 305. In step S717, in response to determining the planarity of the acid-labile film 325 is below the predetermined threshold, a second deposition of the acid-labile film 325 can be deposited overtop the acid-labile film 325 after removing the portions of the acid-labile film 325 solubilized by the acid. Subsequently, the process of depositing the acid source film 330, projecting the pattern of radiation, and removing the solubilized portions of the acid-labile film 325 can be repeated.

Figure 8:
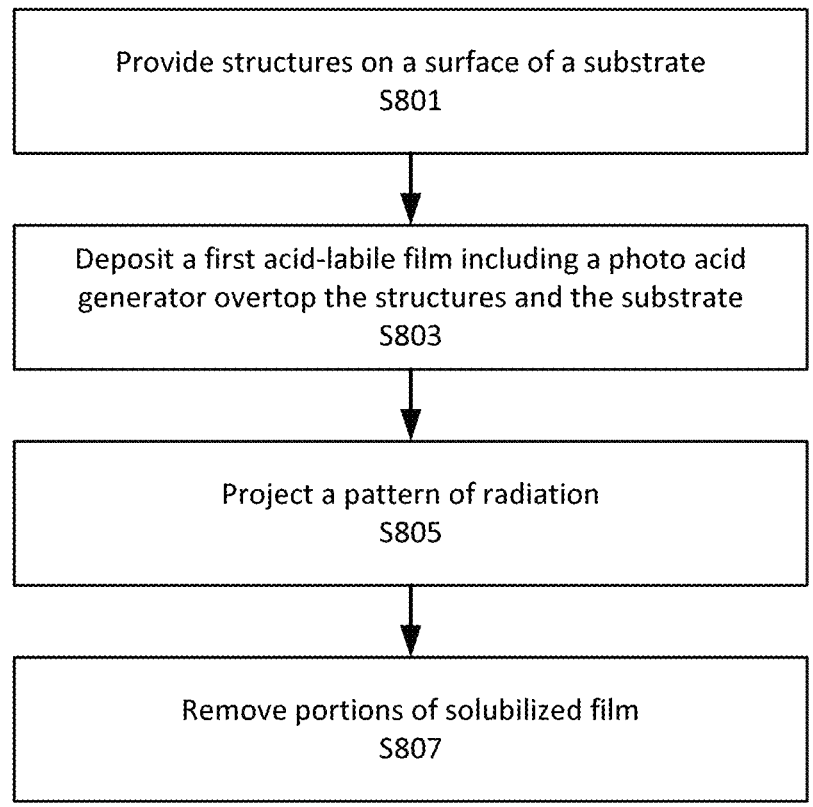
FIG. 8 is a flow chart for showing a method of planarizing films, according to an embodiment of the present disclosure.

FIG. 8 shows a flow chart for a method of planarizing films 800, according to an embodiment of the present disclosure. In step S801, the line spacers 305 are provided on the surface of the substrate 301. In step S803, the acid-labile film 325 is deposited overtop the line spacers 305 and the substrate 301. Notably, the acid-labile film 325 can include the PAG embedded in the film. In step S805, the pattern of radiation is projected over the acid-labile film 325 to solubilize the acid from the PAG and subsequently the acid will solubilize portions of the acid-labile film 325. In step S80, portions of the acid-labile film 325 that were solubilized by the acid are removed by a removal fluid, such as developer.

In summary, the present disclosure relates to a method of planarizing a film, including providing structures on a surface of a substrate, the structures having a spatially variable density across the surface; depositing a first acid-labile film overtop the structures and the substrate, the first acid-labile film filling between the structures; depositing a second acid-labile film overtop the first acid-labile film; depositing an acid source film overtop the second acid-labile film, the acid source film including an acid generator configured to generate an acid in response to receiving radiation having a predetermined wavelength of light; and projecting a pattern of radiation over the acid source film, the radiation having a spatially variable intensity at predetermined areas of the pattern of radiation.

Portions of the second acid-labile film solubilized by acid diffused from the acid source film can be removed. The solubilized portions being not protected from a predetermined removal fluid. A planarity can be determined of the second acid-labile film after removing the portions of the second acid-labile film solubilized by the acid. In response to determining the planarity of the second acid-labile film is above a predetermined threshold, the predetermined threshold being determined by a height of the structures, the second acid-labile film can be recessed below a predetermined thickness. In response to determining the planarity of the second acid-labile film is below the predetermined threshold, a second deposition of the second acid-labile film can be executed overtop the second acid-labile film after removing the portions of the second acid-labile film solubilized by the acid. The pattern of radiation can be determined by emulating deposition of the first acid-labile film overtop the structures on the surface of the substrate.

Projecting the pattern of radiation over the acid source film can include varying the spatially variable intensity of the radiation based on a height map that characterizes height values along a top surface of the second acid-labile film across the substrate. The acid generator can be a photo acid generator (PAG), and projecting the pattern of radiation causes the PAG to generate acid in response to receiving the radiation. A concentration of the acid generated at the predetermined areas of the pattern of radiation can be based on the height map. The second acid-labile film can have a solubility shift in response to presence of the acid above a predetermined concentration threshold. A layer pattern of the first acid-labile film can be transferred into an underlying layer.

The substrate can be baked for a predetermined time and at a predetermined temperature. The baking drives diffusion of acid into the second acid-labile film, and a diffusion distance of the acid into the second acid-labile film is based on the predetermined time and the predetermined temperature. Projecting the pattern of radiation can be performed by a pixel-based projection system including an array of independently addressable projection points, or can be performed by using a reticle to form the pattern of radiation. A topology of the first acid-labile film deposited can be non-planar and based on the spatially variable density of the structures.

The disclosure additionally relates to a method of planarizing a film, including: providing structures on a surface of a substrate, the structures having a spatially variable density across the surface; depositing a first acid-labile film overtop the structures and the substrate, the first acid-labile film filling between the structures; depositing an acid source film overtop the first acid-labile film, the acid source film including an acid generator configured to generate an acid in response to receiving radiation having a predetermined wavelength of light; generating a correction pattern of radiation to project on the acid source film by emulating a fabrication process of the structures and the deposition of the first acid-labile film overtop the structures and the substrate; and projecting the correction pattern of radiation over the acid source film, the radiation having a spatially variable intensity at predetermined areas of the pattern of radiation.

The correction pattern of radiation to project on the acid source film can be generated by emulating a fabrication process of the structures and the deposition of the first acid-labile film overtop the structures and the substrate. Projecting the correction pattern of radiation over the acid source film can include varying the spatially variable intensity of the radiation based on a height map that characterizes height values along a top surface of the first acid-labile film across the substrate. The acid generator can be a photo acid generator (PAG). Projecting the correction pattern of radiation can cause the PAG to generate acid in response to receiving the radiation. A concentration of the acid generated at the predetermined areas of the correction pattern of radiation can be based on a height map. Portions of the first acid-labile film solubilized by acid diffused can be removed from the acid source film, the solubilized portions being not protected from a predetermined removal fluid. A planarity of the first acid-labile film can be determined after removing the portions of the first acid-labile film solubilized by the acid. In response to determining the planarity of the first acid-labile film is above a predetermined threshold, the predetermined threshold being determined by a height of the structures, the first acid-labile film can be recessed below a predetermined thickness. In response to determining the planarity of the first acid-labile film is below the predetermined threshold, a second deposition of the first acid-labile film is deposited overtop the first acid-labile film after removing the portions of the first acid-labile film solubilized by the acid.

The disclosure additionally relates to a method of planarizing a film, including: providing structures on a surface of a substrate, the structures having a spatially variable density across the surface; depositing a first acid-labile film overtop the structures and the substrate, the first acid-labile film filling between the structures, the first acid-labile film including an embedded acid generator configured to generate an acid in response to receiving radiation having a predetermined wavelength of light, the first acid-labile film being soluble to the acid; and projecting a pattern of radiation over the first acid-labile film, the radiation having a spatially variable intensity at predetermined areas of the pattern of radiation.

The disclosure additionally relates to a method of planarizing a substrate, including: accessing mask layout data that defines an initial lithographic pattern to be exposed on a substrate to result in a first topographic pattern; emulating first microfabrication processing on a first model of the first topographic pattern resulting in a second model of a second topographic pattern, the second topographic pattern having structures with reduced pitch as compared to structures from the first topographic pattern; emulating second microfabrication processing on the second model of the second topographic pattern resulting in a third model having an overcoat deposited on the second topographic pattern, the third model of the overcoat including predicted z-height values of the overcoat across the substrate; generating correction mask layout data based on the predicted z-height values of the overcoat; processing the substrate according to the first microfabrication processing and the second microfabrication processing, resulting in the overcoat deposited on the second topographic pattern; and projecting a pattern of actinic radiation onto the substrate, the pattern of actinic radiation being a z-height modification pattern based on the correction mask layout data.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of planarizing a film, the method comprising:
providing structures on a surface of a substrate, the structures having a spatially variable density across the surface;
depositing a first acid-labile film overtop the structures and the substrate, the first acid-labile film filling between the structures;
depositing a second acid-labile film overtop the first acid-labile film;
depositing an acid source film overtop the second acid-labile film, the acid source film including an acid generator configured to generate an acid in response to receiving radiation having a predetermined wavelength of light; and
projecting a pattern of radiation over the acid source film, the radiation having a spatially variable intensity at predetermined areas of the pattern of radiation.

2. The method of claim 1, further comprising:
removing portions of the second acid-labile film solubilized by acid diffused from the acid source film, the solubilized portions being not protected from a predetermined removal fluid.

3. The method of claim 2, further comprising:
determining a planarity of the second acid-labile film after removing the portions of the second acid-labile film solubilized by the acid; and
in response to determining the planarity of the second acid-labile film is above a predetermined threshold, the predetermined threshold being determined by a height of the structures, recessing the second acid-labile film below a predetermined thickness.

4. The method of claim 3, wherein in response to determining the planarity of the second acid-labile film is below the predetermined threshold, depositing a second deposition of the second acid-labile film overtop the second acid-labile film after removing the portions of the second acid-labile film solubilized by the acid.

5. The method of claim 1, wherein the pattern of radiation is determined by emulating deposition of the first acid-labile film overtop the structures on the surface of the substrate.

6. The method of claim 1, wherein projecting the pattern of radiation over the acid source film includes varying the spatially variable intensity of the radiation based on a height map that characterizes height values along a top surface of the second acid-labile film across the substrate.

7. The method of claim 6, wherein
the acid generator is a photo acid generator (PAG);
projecting the pattern of radiation causes the PAG to generate acid in response to receiving the radiation; and
a concentration of the acid generated at the predetermined areas of the pattern of radiation is based on the height map.

8. The method of claim 1, wherein the second acid-labile film has a solubility shift in response to presence of the acid above a predetermined concentration threshold.

9. The method of claim 8, further comprising:
transferring a layer pattern of the first acid-labile film into an underlying layer.

10. The method of claim 1, further comprising:
baking the substrate for a predetermined time and at a predetermined temperature, wherein the baking drives diffusion of acid into the second acid-labile film; and
a diffusion distance of the acid into the second acid-labile film is based on the predetermined time and the predetermined temperature.

11. The method of claim 1, wherein projecting the pattern of radiation is performed by a pixel-based projection system including an array of independently addressable projection points.

12. The method of claim 1, wherein projecting the pattern of radiation is performed by using a reticle to form the pattern of radiation.

13. The method of claim 1, wherein a topology of the first acid-labile film deposited is non-planar and based on the spatially variable density of the structures.

14. A method of planarizing a film, the method comprising:
providing structures on a surface of a substrate, the structures having a spatially variable density across the surface;
depositing a first acid-labile film overtop the structures and the substrate, the first acid-labile film filling between the structures, the first acid-labile film being in contact with the structures;
depositing an acid source film overtop the first acid-labile film, the acid source film including an acid generator configured to generate an acid in response to receiving radiation having a predetermined wavelength of light; and
projecting a correction pattern of radiation over the acid source film, the correction pattern of radiation having a spatially variable intensity at predetermined areas of the correction pattern of radiation.

15. The method of claim 14, further comprising:
generating the correction pattern of radiation to project on the acid source film by emulating a fabrication process of the structures and the deposition of the first acid-labile film overtop the structures and the substrate.

16. The method of claim 15, wherein projecting the correction pattern of radiation over the acid source film includes varying the spatially variable intensity of the radiation based on a height map that characterizes height values along a top surface of the first acid-labile film across the substrate.

17. The method of claim 15, wherein
the acid generator is a photo acid generator (PAG);
projecting the correction pattern of radiation causes the PAG to generate acid in response to receiving the radiation; and
a concentration of the acid generated at the predetermined areas of the correction pattern of radiation is based on a height map.

18. The method of claim 14, further comprising:
removing portions of the first acid-labile film solubilized by acid diffused from the acid source film, the solubilized portions being not protected from a predetermined removal fluid.

19. The method of claim 18, further comprising:
determining a planarity of the first acid-labile film after removing the portions of the first acid-labile film solubilized by the acid; and
in response to determining the planarity of the first acid-labile film is above a predetermined threshold, the predetermined threshold being determined by a height of the structures, recessing the first acid-labile film below a predetermined thickness.

20. The method of claim 19, wherein in response to determining the planarity of the first acid-labile film is below the predetermined threshold, depositing a second deposition of the first acid-labile film overtop the first acid-labile film after removing the portions of the first acid-labile film solubilized by the acid.

* * * * *